United States Patent
Endres et al.

(10) Patent No.: US 8,194,791 B2
(45) Date of Patent: *Jun. 5, 2012

(54) JOINT, ADAPTIVE CONTROL OF EQUALIZATION, SYNCHRONIZATION, AND GAIN IN A DIGITAL COMMUNICATIONS RECEIVER

(75) Inventors: Thomas J. Endres, Seattle, WA (US); Christopher D. Long, Maple Valley, WA (US); Wonzoo Chung, Kent, WA (US); Rory Fagan, Mukilteo, WA (US)

(73) Assignee: Omereen Wireless, LLC, Dover, DE (US)

( * ) Notice: Subject to any disclaimer, the term of this patent is extended or adjusted under 35 U.S.C. 154(b) by 312 days.

This patent is subject to a terminal disclaimer.

(21) Appl. No.: 12/546,605

(22) Filed: Aug. 24, 2009

(65) Prior Publication Data

US 2010/0061488 A1   Mar. 11, 2010

Related U.S. Application Data

(63) Continuation of application No. 10/782,316, filed on Feb. 19, 2004, now Pat. No. 7,580,482.

(60) Provisional application No. 60/448,643, filed on Feb. 19, 2003.

(51) Int. Cl.
*H04L 27/00* (2006.01)
(52) U.S. Cl. .......................... 375/326; 375/325
(58) Field of Classification Search .................. 375/326, 375/345, 229, 327, 339, 260
See application file for complete search history.

(56) References Cited

U.S. PATENT DOCUMENTS

| | | | |
|---|---|---|---|
| 2,138,330 | A | 11/1938 | Thompson |
| 2,977,551 | A | 3/1961 | Gibson et al. |
| 3,386,033 | A | 5/1968 | Copeland et al. |
| 3,703,685 | A | 11/1972 | Simopoulos et al. |
| 3,714,659 | A | 1/1973 | Firman |
| 3,774,218 | A | 11/1973 | Fowler |
| 3,838,444 | A | 9/1974 | Loughlin et al. |
| 3,873,771 | A | 3/1975 | Kleinerman et al. |
| 3,924,060 | A | 12/1975 | Bedford |
| 3,974,449 | A | 8/1976 | Falconer |
| 3,984,624 | A | 10/1976 | Waggener |
| 3,999,005 | A | 12/1976 | Dickinson |
| 4,081,497 | A | 3/1978 | Tokumitsu et al. |
| 4,115,778 | A | 9/1978 | Snow |
| 4,128,880 | A | 12/1978 | Cray, Jr. |
| 4,302,626 | A | 11/1981 | Streeter |
| 4,310,920 | A | 1/1982 | Hayes |
| 4,316,215 | A | 2/1982 | Yasumoto et al. |

(Continued)

FOREIGN PATENT DOCUMENTS

EP    0308241 A2    3/1989

(Continued)

OTHER PUBLICATIONS

Lucky, R.W.: "Techniques for adaptive equalization of digital communication systems," Bell Systems Technical Journal, vol. 45, No. 2, pp. 255-286, Feb. 1966.

(Continued)

*Primary Examiner* — Emmanuel Bayard

(57) ABSTRACT

Various aspects and embodiments of the present invention derive statistics of received signal quality and use these statistics to jointly control operation of timing recovery, carrier recovery, automatic gain control, and equalization functions.

45 Claims, 14 Drawing Sheets

U.S. PATENT DOCUMENTS

| | | |
|---|---|---|
| 4,322,842 A | 3/1982 | Martinez |
| 4,337,479 A | 6/1982 | Tomimoto et al. |
| 4,379,947 A | 4/1983 | Warner |
| 4,459,595 A | 7/1984 | Kramer et al. |
| 4,459,681 A | 7/1984 | Ohtsuka |
| 4,469,437 A | 9/1984 | Yuasa et al. |
| 4,476,484 A | 10/1984 | Haskell |
| 4,513,415 A | 4/1985 | Martinez |
| 4,523,225 A | 6/1985 | Masuda et al. |
| 4,535,352 A | 8/1985 | Haskell |
| 4,551,011 A | 11/1985 | Yuasa et al. |
| 4,575,225 A | 3/1986 | Yuasa et al. |
| 4,576,470 A | 3/1986 | Yuasa et al. |
| 4,587,495 A | 5/1986 | Osawa et al. |
| 4,589,011 A | 5/1986 | Rzeszewski |
| 4,602,260 A | 7/1986 | Lindenmeier et al. |
| 4,607,230 A | 8/1986 | Kaku et al. |
| 4,704,025 A | 11/1987 | Yuasa et al. |
| 4,750,036 A | 6/1988 | Martinez |
| 4,754,233 A | 6/1988 | Pickett |
| 4,821,097 A | 4/1989 | Robbins |
| 4,870,489 A | 9/1989 | Ducret |
| 4,879,606 A | 11/1989 | Walter et al. |
| 4,882,614 A | 11/1989 | Kageyama et al. |
| 4,882,725 A | 11/1989 | Noda et al. |
| 4,907,218 A | 3/1990 | Inoue et al. |
| 4,926,244 A | 5/1990 | Isnardi |
| 4,928,177 A | 5/1990 | Martinez |
| 4,944,032 A | 7/1990 | Kageyama et al. |
| 4,958,230 A | 9/1990 | Jonnalagadda et al. |
| 4,985,769 A | 1/1991 | Yasumoto et al. |
| 5,006,926 A | 4/1991 | Tsinberg |
| 5,019,830 A | 5/1991 | Harada |
| 5,036,386 A | 7/1991 | Yasumoto et al. |
| 5,038,402 A | 8/1991 | Robbins |
| 5,087,975 A | 2/1992 | Citta et al. |
| 5,093,718 A | 3/1992 | Hoarty et al. |
| 5,103,295 A | 4/1992 | Uwabata et al. |
| 5,103,310 A | 4/1992 | Gibson et al. |
| 5,126,998 A | 6/1992 | Stern, Jr. |
| 5,132,988 A | 7/1992 | Fisher et al. |
| 5,134,464 A | 7/1992 | Basile et al. |
| 5,142,353 A | 8/1992 | Kageyama et al. |
| 5,151,783 A | 9/1992 | Faroudja |
| 5,172,126 A | 12/1992 | Naito |
| 5,177,604 A | 1/1993 | Martinez |
| 5,214,501 A | 5/1993 | Cavallerano et al. |
| 5,220,420 A | 6/1993 | Hoarty et al. |
| 5,235,619 A | 8/1993 | Beyers, II et al. |
| 5,243,423 A | 9/1993 | DeJean et al. |
| 5,247,351 A | 9/1993 | Cho |
| 5,270,817 A | 12/1993 | Hayashi et al. |
| 5,276,507 A | 1/1994 | Uwabata et al. |
| 5,287,180 A | 2/1994 | White |
| 5,291,289 A | 3/1994 | Hulyalkar et al. |
| 5,293,633 A | 3/1994 | Robbins |
| 5,321,514 A | 6/1994 | Martinez |
| 5,327,460 A | 7/1994 | Batruni |
| 5,357,284 A | 10/1994 | Todd |
| 5,379,324 A | 1/1995 | Mueller et al. |
| 5,386,239 A | 1/1995 | Wang et al. |
| 5,412,720 A | 5/1995 | Hoarty |
| 5,430,661 A | 7/1995 | Fisher et al. |
| 5,442,403 A | 8/1995 | Yasumoto et al. |
| 5,448,299 A | 9/1995 | Yang et al. |
| 5,461,426 A | 10/1995 | Limberg et al. |
| 5,534,933 A | 7/1996 | Yang |
| 5,550,578 A | 8/1996 | Hoarty et al. |
| 5,550,579 A | 8/1996 | Martinez |
| 5,557,316 A | 9/1996 | Hoarty et al. |
| 5,559,559 A | 9/1996 | Jungo et al. |
| 5,563,664 A | 10/1996 | Yang et al. |
| 5,579,055 A | 11/1996 | Hamilton et al. |
| 5,585,975 A | 12/1996 | Bliss |
| 5,586,121 A | 12/1996 | Moura et al. |
| 5,587,743 A | 12/1996 | Montgomery et al. |
| 5,589,872 A | 12/1996 | Martinez |
| 5,596,361 A | 1/1997 | Martinez |
| 5,600,573 A | 2/1997 | Hendricks et al. |
| 5,617,148 A | 4/1997 | Montgomery |
| 5,666,168 A | 9/1997 | Montgomery et al. |
| 5,673,293 A | 9/1997 | Scarpa et al. |
| 5,694,424 A | 12/1997 | Ariyavisitakul |
| 5,714,965 A | 2/1998 | Taguchi |
| 5,734,853 A | 3/1998 | Hendricks et al. |
| RE35,774 E | 4/1998 | Moura et al. |
| 5,742,902 A | 4/1998 | Shore |
| 5,809,086 A | 9/1998 | Ariyavisitakul |
| 5,812,184 A | 9/1998 | Martinez |
| 5,818,441 A | 10/1998 | Throckmorton et al. |
| 5,818,845 A | 10/1998 | Moura et al. |
| 5,828,655 A | 10/1998 | Moura et al. |
| 5,859,852 A | 1/1999 | Moura et al. |
| 5,881,302 A | 3/1999 | Omata |
| 5,909,253 A | 6/1999 | Jonnalagadda et al. |
| 5,946,047 A | 8/1999 | Levan |
| 5,946,048 A | 8/1999 | Levan |
| 5,946,322 A | 8/1999 | Moura et al. |
| 5,946,351 A | 8/1999 | Ariyavisitakul et al. |
| 5,956,346 A | 9/1999 | Levan |
| 5,959,660 A | 9/1999 | Levan |
| 5,959,997 A | 9/1999 | Moura et al. |
| 5,961,603 A | 10/1999 | Kunkel et al. |
| 5,994,891 A | 11/1999 | Hubbell |
| 5,995,168 A | 11/1999 | Yagi |
| 5,995,563 A | 11/1999 | Ben-Efraim et al. |
| 6,005,850 A | 12/1999 | Moura et al. |
| 6,012,161 A | 1/2000 | Ariyavisitakul et al. |
| 6,016,316 A | 1/2000 | Moura et al. |
| 6,018,526 A | 1/2000 | Liu et al. |
| 6,018,764 A | 1/2000 | Field et al. |
| 6,034,678 A | 3/2000 | Hoarty et al. |
| 6,047,159 A | 4/2000 | Powell et al. |
| 6,066,993 A | 5/2000 | Yamamoto et al. |
| 6,073,030 A | 6/2000 | Nair et al. |
| 6,100,883 A | 8/2000 | Hoarty |
| 6,104,727 A | 8/2000 | Moura et al. |
| 6,192,384 B1 | 2/2001 | Dally et al. |
| 6,201,536 B1 | 3/2001 | Hendricks et al. |
| 6,226,323 B1 | 5/2001 | Tan et al. |
| 6,240,133 B1 | 5/2001 | Sommer et al. |
| 6,249,180 B1 | 6/2001 | Maalej et al. |
| 6,268,774 B1 | 7/2001 | Soumyanath |
| 6,305,020 B1 | 10/2001 | Hoarty et al. |
| 6,310,548 B1 | 10/2001 | Stephens, Jr. et al. |
| 6,314,134 B1 | 11/2001 | Werner et al. |
| 6,341,360 B1 | 1/2002 | Abdelilah et al. |
| 6,356,586 B1 | 3/2002 | Krishnamoorthy et al. |
| 6,366,613 B2 | 4/2002 | Sommer et al. |
| 6,370,160 B1 | 4/2002 | Knutson et al. |
| 6,370,571 B1 | 4/2002 | Medin, Jr. |
| 6,377,529 B1 | 4/2002 | Lee et al. |
| 6,385,237 B1 | 5/2002 | Tsui et al. |
| 6,426,973 B1 | 7/2002 | Madhow et al. |
| 6,433,835 B1 | 8/2002 | Hartson et al. |
| 6,501,310 B2 | 12/2002 | Takami |
| 6,510,553 B1 | 1/2003 | Hazra |
| 6,563,862 B1 * | 5/2003 | Knutson et al. ............. 375/219 |
| 6,574,293 B1 * | 6/2003 | Khayrallah et al. .......... 375/347 |
| 6,665,790 B1 | 12/2003 | Glossner, III et al. |
| 6,680,971 B1 | 1/2004 | Tazebay et al. |
| 6,754,277 B1 | 6/2004 | Heinzelman et al. |
| 6,754,293 B1 * | 6/2004 | Henriksson et al. .......... 375/346 |
| 6,754,715 B1 | 6/2004 | Cannon et al. |
| 6,791,995 B1 | 9/2004 | Azenkot et al. |
| 6,816,548 B1 | 11/2004 | Shiue et al. |
| 6,829,298 B1 | 12/2004 | Abe et al. |
| 6,834,039 B1 | 12/2004 | Kelly et al. |
| 6,904,098 B1 | 6/2005 | Isaksen et al. |
| 6,980,602 B1 | 12/2005 | Kleinerman et al. |
| 6,985,549 B1 | 1/2006 | Biracree et al. |
| 7,027,500 B1 | 4/2006 | Casas et al. |
| 7,027,528 B2 | 4/2006 | Liu et al. |
| 7,031,405 B1 | 4/2006 | Touzni et al. |
| 7,158,567 B2 | 1/2007 | Wang et al. |
| 7,580,482 B2 * | 8/2009 | Endres et al. ............. 375/326 |
| 2001/0022813 A1 | 9/2001 | Tan et al. |

| | | | |
|---|---|---|---|
| 2002/0056140 | A1 | 5/2002 | Oishi et al. |
| 2002/0059597 | A1 | 5/2002 | Kikinis et al. |
| 2002/0104083 | A1 | 8/2002 | Hendricks et al. |
| 2002/0186764 | A1 | 12/2002 | Amin et al. |
| 2003/0035468 | A1 | 2/2003 | Corbaton et al. |
| 2003/0095590 | A1 | 5/2003 | Fuller et al. |
| 2003/0156603 | A1 | 8/2003 | Rakib et al. |
| 2003/0202568 | A1* | 10/2003 | Choi et al. .................... 375/148 |
| 2004/0042566 | A1 | 3/2004 | Eidson et al. |
| 2006/0181797 | A1 | 8/2006 | Sugawara et al. |

FOREIGN PATENT DOCUMENTS

| | | |
|---|---|---|
| EP | 0577351 A2 | 1/1994 |
| EP | 1156634 A1 | 11/2001 |
| WO | WO-9222983 A2 | 12/1992 |
| WO | WO-9423470 A1 | 10/1994 |
| WO | WO-9501676 A1 | 1/1995 |
| WO | WO-9955087 A1 | 10/1999 |
| WO | WO-0072446 A1 | 11/2000 |
| WO | WO-0207425 A2 | 1/2002 |
| WO | WO-02084965 A1 | 10/2002 |

OTHER PUBLICATIONS

Godard, D. N.: "Self-recovering equalization and carrier tracking in two-dimensional data communication systems," IEEE Transactions on Communications, vol. 28, No. 11, pp. 1867-1875, Oct. 1980.

Treichler, J. R., and Agee, B.G.: "A new approach to multipath correction of constant modulus signals," IEEE Transactions on Acoustics, Speech, and Signal Processing, vol. ASSP-31, No. 2, pp. 459-472, Apr. 1983.

Casas R. A., et al.: "Current approaches to blind decision feedback equalization," in the textbook, "Signal processing advances in wireless and mobile communications: trends in channel estimation and equalization," edited by G. Giannakis, et al., Prentice Hall, Upper Saddle River, NJ, 2000.

Daneshard, B. et al. "Finite Wordlength Requirements for Adaptive Signal Processing Elements in Digital QAM ADSL Systems." Communications, 1994, Supercomm/ICC '94, Conference Record, Serving Humanity Through Communications, May 1, 1994.

Naito, T. et al. Adaptive Equalization Based on Internal Model Principle for Time-Varying Fading Channels. IEEE, Oct. 1, 2001, p. 363-368, XP010521667.

Ciciora, Dukes, Hartson, Hoarty, Embedding high-speed data in analog signals, CED Magazine, Dec. 2001, p. 92-100.

Ciciora et al., "Modern Cable Television Technology: Video, Voice, and Data Communications," 1999.

Ormiston, et al "Compact Low Noise Receiving Antenna," IEEE Electronics Letters, Jul. 9, 1998, vol. 34, No. 14, pp. 1367-1368.

Tooley et al., "Active Receiving Antenna," Practical Wireless, Mar. 1981, vol. 57, No. 3, pp. 52-55.

Chen, B., "The Key to Unlocking Network Assets: Increasing Capacity by Embedding Content in Current Video Transmissions," CED Magazine, Dec. 2001. http://www.cedmagazine.com/ced/2001/1201/12f.htm.

Press Release of WavePhore, Inc. entitled "WavePhore and the Canadian Broadcasting Corporation Enter an Agreement to Deliver Data Broadcasting Nationwide in Canada," Mar. 29, 1995.

Advertisement in Investor's Business Daily, "Technology Offers TV Broadcasters an Avenue Into Interactive Services," Apr. 19, 1993.

News Release of WavePhore, entitled "WavePhore and Belcom Sign Agreement to Co-Develop Russian Data Broadcasting System" (two pages, believed to have been released Apr. 10, 1995).

Press Release of WavePhore entitled FCC Proposed to Allow Digital Data Transmission Within the Video Portion of TV Broadcasts, in Response to WavePhore's Request, (two pages, believed to have been released Apr. 25, 1995).

Advertisement in The Indianapolis News, WavePhore Stock Is On Roll, May 23, 1995.

Advertisement in Investor's Business Daily, Intel, WavePhore Set Technology Alliance, dated Monday, May 8, 1995.

Press Release, entitled Intel and WavePhore Sign Technology and Investment Agreement, (two pages, believed to have been released May 5, 1995).

Advertisement, The Arizona Republic Business, "Tempe firm, Intel Team Up to Send Data via TV," May 6, 1995.

Advertisement, Arizona Business Gazette, entitled "Skyway System Rides TV Signals to Distribute Data—Speed Key to WavePhore Technology," Jul. 13, 1995.

Advertisement, Arizona Business Gazette, entitled "Motivated CEO Leads WavePhore," Jul. 13, 1995.

Press Release of WavePhore, entitled WavePhore Develops Data Casting System for Television Azteca in Mexico (two pages, believed to have been released Aug. 8, 1995).

Press Release of WavePhore, entitled WavePhore and Arizona State University Launch Distance Learning Service, (two pages, believed to have been released Aug. 17, 1995).

G.M. Glasford, Fundamentals of Television Engineering, McGraw-Hill 1955.

D.G. Fink, Television Engineering, 2nd Edition, McGraw-Hill 1952.

C.G. Eilers, "TV Multichannel Sound—The BTSC System," IEEE Transactions on Consumer electronics, Aug. 1984.

Taylor, "The Vestigal Sideband and Other Tribulations," p. 203 of the 1988 National Cable Television Association Technical Papers.

"HGTV & Vestigal Sidebank Syndrome" in the IEEE Transactions on Broadcasting, Mar. 1990, p. 8.

Wave Generation & Shaping, Leonard Strauss, McGraw-Hill 1970, Chapters 1 and 2.

W. Ciciora et al., "A Tutorial on Ghost Canceling in Television Systems," IEEE Transactions on Consumer Electronics, vol. CE-25, No. 1, Feb. 1979, pp. 9-44.

Hill, et al.—Introduction to Switching Theory & Logical Design, John Wiley & Sons 1968, SBN 471 39880 K.

Tanenbaum, A. "Computer Networks," Prentice Hall 1996, ISBN 0-1-349945-6.

Spohn, D.L., "Data Network Design," McGraw Hill, 1993 ISBN 0-07-06-360-X.

Kaufman, C., "Network Security," Prentice Hall, 1995 ISBN 0-13-061466-1.

Ariyavisitakul et al. "Joint Coding and Decision Feedback Equalization for Broadband Wireless Channels," IEEE, Dec. 1998; pp. 1670-1678: vol. 19; No. 9.

NetMedia, Connecting the NetMedia TriplePlay.TM. Modulator, MM73 Installation Modulators, 201 2000-2003.

NetMedia, Programming the NetMedia TriplePlay.TM. Modulator, MM73 Installation Modulators, .COPYRGT. 2000-2003.

NetMedia, Troubleshooting Tips, Troubleshooting Modulators, pp. 1-2, .COPYRGT. 2000, 2001.

FCC 96-274 Report and Order, Digital Data Transmission Within the Video Portion of Television Broadcast Station Transmissions, Adopted: Jun. 21, 1996, Released Jun. 28, 1996, pp. 1-10, Appendix A, Appendix B.

Rhyne, V.T., Basic Concepts, Chapter 1, pp. 1-27, Fundamentals of Digital Systems Design, Prentice-Hall, Inc., 1973.

International Search Report; PCT Application No. PCT/US2004/0048778, Applicant: Dotcast Inc.; Date of Mailing: Aug. 30, 2004, 5 pages.

Ariyavisitakul E., "Equalization of a Hard-Limited Slowly-Fading Multipath Signal Using a Phase Equalizer with a Time-Reversal Structure," Vehicular Technology Conference, May 6, 1990, Orlando, FL., 1990 IEEE, New York, 7 pages.

Evans, G. "More Tools of the Trade: Modulators, Inside Custom A/V," http://www.hometeam.com/beta/0009customav.shtml, [accessed on Jan. 7, 2004].

Non-Final Office Action; U.S. Appl. No. 10/782,316 Mailed on Apr. 4, 2007; 6 pages.

Final Office Action; U.S. Appl. No. 10/782,316 Mailed on Dec. 27, 2007; 8 pages.

Non-Final Office Action; U.S. Appl. No. 10/782,316 Mailed on Apr. 7, 2008; 6 pages.

Final Office Action; U.S. Appl. No. 10/782,316 Mailed on Nov. 14, 2008; 8 pages.

Notice of Allowance; U.S. Appl. No. 10/782,316 Mailed on Apr. 16, 2009, 6 pages.

* cited by examiner

JOINT, ADAPTIVE CONTROL OF EQUALIZATION, SYNCHRONIZATION, AND GAIN IN A DIGITAL COMMUNICATIONS RECEIVER

CROSS-REFERENCE TO RELATED APPLICATIONS

This application is a continuation application of commonly assigned U.S. patent application Ser. No. 10/782,316, filed on Feb. 19, 2004 now U.S. Pat. No. 7,580,482, and entitled "JOINT, ADAPTIVE CONTROL OF EQUALIZATION, SYNCHRONIZATION, AND GAIN IN A DIGITAL COMMUNICATIONS RECEIVER," which claims priority to U.S. Provisional Patent Application Ser. No. 60/448,643 filed on Feb. 19, 2003, both of which are hereby incorporated herein in their entirety by reference.

FIELD OF INVENTION

The present invention relates to the control of functions in a communications receiver that govern physical layer operations of equalization, synchronization (carrier frequency and phase, and timing recovery), and automatic gain control. These functions are controlled from a central signal processing and logic block to achieve robust, autonomous receiver operation.

BACKGROUND OF INVENTION

In many digital communication systems, a source generates digital information, such as data, audio, or video, that is to be transmitted to multiple receivers. The digital information bits are divided into blocks that define a discrete alphabet of symbols. These symbols are used to modulate a radio frequency (RF) carrier's frequency, amplitude and/or phase. For example, a quadrature oscillator can be used to modulate the symbols onto the amplitude and phase of the RF carrier, and the signaling is referred to as Quadrature Amplitude Modulation (QAM). The time between adjacent symbols is referred to as the baud (or symbol) period, and inverse as baud (or symbol) rate.

The data-bearing RF carrier is amplified and transmitted through a propagation medium, for example, a cable, phone line, wireless terrestrial, satellite, underwater link, etc. As consumer appetite for information on demand continues to increase, so do requirements on data rates of present and emerging systems. Higher data rates increase the susceptibility of the data-bearing RF signal to environment-induced distortions such as fades, multipath (causing inter-symbol interference (ISI)), Doppler conditions, and additive noise processes. Communications receivers typically implement multiple stages of signal processing to individually address impairments witnessed by the RF signal en route to the receiver, and also introduced by the receiver and transmitter themselves, for example, due to implementation with finite-length filters and finite-precision arithmetic. Typical functions that govern physical layer operation include equalization, synchronization to carrier phase and frequency, synchronization to baud sampling phase and frequency, and automatic gain control.

Gain control processing adjusts the received signal to within the proper dynamic range expected by the receiver. Usually, gain control is itself done in stages, for example, at the RF level by the tuner, after RF to IF translation, and digitally within front-end and back-end signal processing. Most commercial UHF/VHF tuners include automatic gain control (AGC) circuits that tradeoff performance between adjacent and co-channel interference using average or peak power levels. AGC at the IF level usually adjusts the signal so that the full dynamic range of analog-to-digital conversion is utilized, without saturation. Sometimes, AGC utilizes pilot or reference tones or signals that are known, stored, or derived in the receiver to adjust IF AGC circuitry. In the digital domain, AGC circuitry may also use pilot or reference aids, or may operate blindly without the use of such overheard. For example, U.S. Ser. No. 60/341,931, entitled "Self-initializing decision feedback equalizer with automatic gain control," by T. J. Endres et al., filed Dec. 17, 2001, which is incorporated herein by this reference, describes an automatic gain control (AGC) circuit that is nested with a decision feedback equalizer (DFE) structure, which operates on novel error signals that are blind (do not use training, reference, or pilot aids). Similarly, U.S. Ser. No. 10/246,084, entitled, "Adaptive expanded information capacity for communications systems," by C. Long et al., filed Sep. 8, 2002, which is incorporated herein by reference, describes a similar feedback AGC circuit that is nested with an equalizer and uses decision-directed (DD) error adjustment.

Timing recovery refers to the process of synchronization to correct baud sampling frequency and phase. Sometimes, the oscillator clock that adjusts the analog-to-digital converter (ADC) at the input to the receiver is adjusted in frequency and phase. Alternatively, the sampled data in the receiver can be interpolated to achieve proper baud sampling. This second approach can reduce complexity by eliminating costly oscillator circuitry needed to control the ADC in the first approach. Timing recovery methods sometimes try to detect zero-crossings of the received signal in the time domain. As such, some methods apply filtering techniques to upper and lower band edges of the data spectrum. For example, see U.S. Pat. No. 5,872,815 by C. Strolle et al, entitled "Apparatus for generating timing signals for a digital receiver" which is incorporated by this reference. Alternatively, another approach uses a decision-directed (DD) technique, usually requiring feedback from a decision device, or slicer, or quantizer. The DD methods described by Mueller and Muller in "Timing recovery in digital synchronous data receivers," IEEE Transactions on Communications, vol. COM-24, no. 5, May 1976, which is incorporated by this reference, are widely applied. Other blind algorithms, usually applied solely to equalization, have lately been successfully applied to timing recovery, too. For example, Guglielmi et al. in "Joint Clock Recovery and Baseband Combining for the Diversity Radio Channel," IEEE Transactions on Communications, vol. 44. p. 114-117, January 1996, which is incorporated by this reference, jointly applies a Constant Modulus Algorithm (CMA), originally proposed by D. N. Godard in "Self-recovering equalization in two-dimensional data communication systems," IEEE Transactions on Communications, vol. 28, no. 11, pp. 1867-1875, October 1980, which is also incorporated by this reference, for equalization, to joint optimization of equalization and timing recovery. This joint optimization is further analyzed by Chung et al. in "Timing Recovery Based on Dispersion Minimization," Proceedings of the 2001 Conference on Information Sciences and Systems, March 2001 which is incorporated by reference.

Equalization in a digital communications receiver is analogous to an equalizer on a stereo system: the equalizer filters the distorted, received waveform (from a tape head or RF antenna) and tries to mitigate distortions and restore the signal properties of the original source. In a digital communications receiver, filter mismatches in transmitter and receiver, finite-precision implementation, and propagation channel effects induce inter-symbol interference (ISI), in which the receiver processes a signal that contains multiple, delayed and weighted copies of the transmitted signal. For example, reflections of the RF signal from a large building will induce ISI (or multipath), and reflections from an airplane will induce multipath distortion with a time-varying Doppler component. Since the exact channel characteristics are not known apriori at the receiver, the equalizer is usually implemented with adaptive methods. Adjustment of filter coefficients can be done with trained equalization methods, relying on the embedding of a pre-determined training sequence in the transmitted data. Usually, equalizer coefficient convergence relies on multiple transmissions of the training sequence, and the channel characteristics are also time varying, requiring periodic re-training. The Least Mean Squares (LMS) algorithm, which was proposed by Widrow, McCool, and Ball, in *The Proceedings of the IEEE*, vol. 63, no. 4, pp. 719-720, April 1975, which is incorporated by reference, minimizes a Mean Squared Error (MSE) cost function and is a stochastic gradient descent update rule utilizing the training sequence. Alternatively, blind methods do not rely on a reference signal, or derive a reference signal from the data itself, and are therefore desirable, since in the absence of a training signal, revenue-generating user data can instead be transmitted. A common blind equalization method replaces the reference signal in the LMS algorithm with the receiver's best guess at the data, and is referred to as Decision Directed LMS (DD-LMS), as proposed in a paper entitled "Techniques for adaptive equalization of digital communication systems," by R. W. Lucky, in the *Bell Systems Technical Journal*, vol. 45, no. 2, pp. 255-286, February 1966 which is incorporated by reference. Unfortunately, DD-LMS needs a reasonably low percentage of incorrect decisions to prevent algorithm divergence, and is therefore impractical from a cold-start initialization. Godard's CMA is an attractive alternative that provides robust signal acquisition in harsh environments. These algorithms are sometimes applied to linear, finite-impulse response (FIR) filters, or decision feedback equalizer (DFE) structures, in which an FIR filter is embedded in a feedback loop (so that the overall impulse response is infinite) that processes hard decision samples from a decision device, slicer, or quantizer. U.S. Ser. No. 60/341,931 by T. J. Endres et al. entitled "Self-initializing decision feedback equalizer with automatic gain control," which is incorporated by reference, uses novel, adaptive combining techniques of soft and hard decision samples in a DFE structure with CMA, LMS, and DD-LMS for robust, blind acquisition and re-acquisition.

Synchronization to carrier frequency and phase is usually done in stages, including, for example, RF to IF translation, IF to passband (or near baseband), and translation to precise baseband. Since the receiver in a coherent communications system must ultimately make hard decisions for symbol estimates, the data-bearing RF signal must ultimately be brought down to precise baseband. Synchronous or quasi-synchronous detectors can be used for intermediate translations. Translation to precise baseband can be done in a DD fashion, by nesting a phase-locked loop with the slicer and equalizer. For example, the instantaneous phase offset between slicer input and output is detected, filtered, and used to drive an oscillator in "Digital Communication" by E. A. Lee and D. G. Messerschmitt, Kluwer Academic Publishers, 1994, which is incorporated by reference. The PLL can be closed at various points within the equalizer. For example, Strolle et al describe alternative DFE architectures for reception of digital television signals that include a DD carrier loop, deriving its input from slicer input and output, but derotating the received signal to precise baseband at various points within the DFE structure. (See: *Feasibility of reliable 8-VSB reception*," C. H. Strolle, S. N. Hulyalkar, T. J. Endres, Proceedings of the NAB Broadcast Engineering Conference, Las Vegas, Nev., pp. 483-488, Apr. 8-13, 2000, which is incorporated by reference.)

The present invention relates to the joint, adaptive, control of physical layer functions that govern equalization, baseband synchronization to precise carrier phase and frequency, baud sampling phase and frequency, and automatic gain control in the digital domain.

SUMMARY OF INVENTION

In accordance with certain aspects and embodiments of the present invention, physical layer functions governing equalization, translation to precise baseband, synchronization of sampling phase and frequency, and automatic gain control in the digital domain are jointly controlled and adapted with a central signal processing and logic block.

BRIEF DESCRIPTION OF DRAWINGS

Other aspects, features, and advantages of various aspects and embodiments of the present invention will become more fully apparent from the following detailed description, the appended claims, and the accompanying drawings in which:

DETAILED DESCRIPTION

Figure 1:
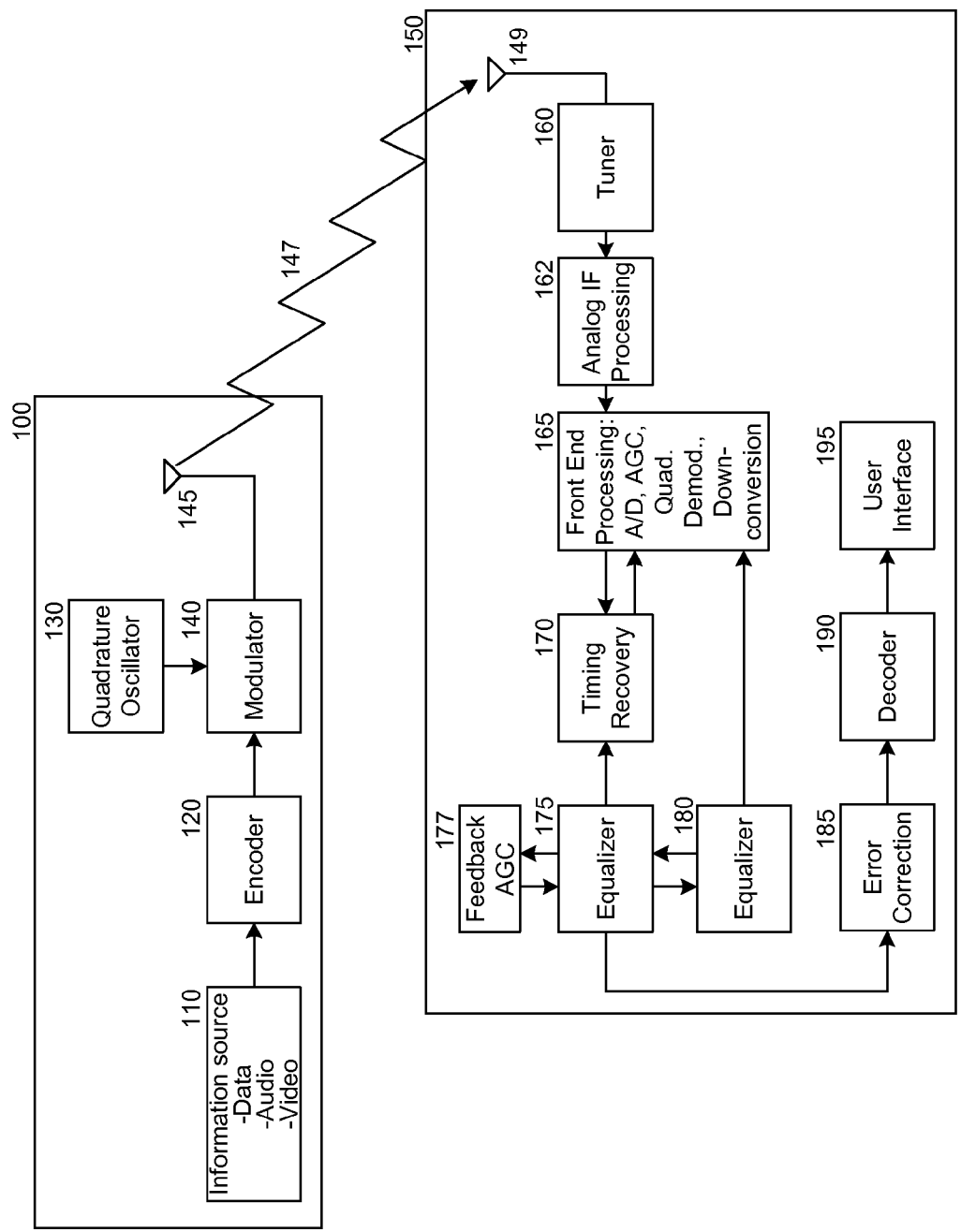
FIG. 1 shows a typical prior-art communication system that may be employed for transmission of digital signals.

FIG. 1 depicts a typical prior art digital communication system. Transmitter station 100 is coupled to receiver 150 by propagation medium 147. The propagation medium could be a cable, telephone twisted-pair wire, satellite link, terrestrial link, or fiber optic connection, for example. Transmitter station 100 includes an information source 110, that contains the content such as data, audio, or video, which is to be communicated to the receiver 150. The information source 110 is coupled to encoder 120, which formats the information in a manner suitable for digital communication, typically in accordance with a given standard or protocol. The encoder 120 is coupled to modulator 140, which is also coupled to a quadrature oscillator 130. The modulator 140 uses the signal from the quadrature oscillator 130 to modulate the encoded information provided by encoder 120 onto a suitable Radio Frequency (RF) carrier frequency in amplitude and phase. The modulated signal from modulator 140 is coupled to transmit antenna 145 for transmission into propagation medium 147.

The receiver 150 receives the RF signal from propagation medium 147 via receiver antenna 149. Receiver antenna 149 is coupled to tuner 160. Tuner 160 is set to receive the RF signal in the desired frequency range, while rejecting signals in nearby or adjacent frequency ranges. Tuner 160 may provide automatic gain control at the RF frequency and also downconvert the received signal to an intermediate frequency (IF) before passing the signal to the analog IF Processing block, 162. Analog IF processing prepares the signal for analog-to-digital conversion, applying filtering and gain control, before passing the signal to the Front End Processing block 165. Front End Processing block 165 samples the signal with an analog-to-digital converter and may contain further automatic gain control and filtering, digital downconversion in frequency, and quadrature demodulation to split the signal into in-phase (I) and quadrature-phase (Q) samples. Front End Processing block 165 is coupled to Timing Recovery module 170 that determines a correct sampling phase. Timing Recovery module 170 may adjust the sampling phase by interpolating the data samples, or adjusting the phase and sampling frequency of the analog-to-digital converter in Front End Processing block 165. Timing Recovery module 170 is coupled to Equalizer 175, which is used to mitigate the distortions, such as inter-symbol interference and noise, that are introduced by the propagation medium 147, transmitter 100, Tuner 160, IF Processing block 162, receiver Front End Processing block 165, and receiver Timing Recovery module 170. Equalizer 175 is coupled to Carrier Recovery module 180, which detects residual offset in frequency and phase. The detected carrier offset in Carrier Recovery module 180 may be supplied back to the Equalizer 175 for translation of equalized samples to precise baseband, or used to adjust the downconversion process in Front End Processing block 165, or both. Also coupled to Equalizer 175 is Feedback AGC module 177, which works in conjunction with Equalizer 175 to detect and correct rapid amplitude variations in the received signal. The output of Equalizer 175 is coupled to Error Correction module 185, which detects and corrects bit errors in the recovered bit stream. The Error Correction module 185 is coupled to Decoder 190, which decodes the bit stream in accordance with the standard or protocol used in the Encoder 120 of Transmitter 100. The decoded bits from Decoder 190 represent the recovered information source, consisting of data, audio, or video, and are supplied to a user interface 195. Certain aspects and embodiments of the present invention are manifested in the joint, adaptive, blind control of Equalizer 175, Carrier Recovery module 180, Timing Recovery module 170, and Feedback AGC module 177.

Figure 2:
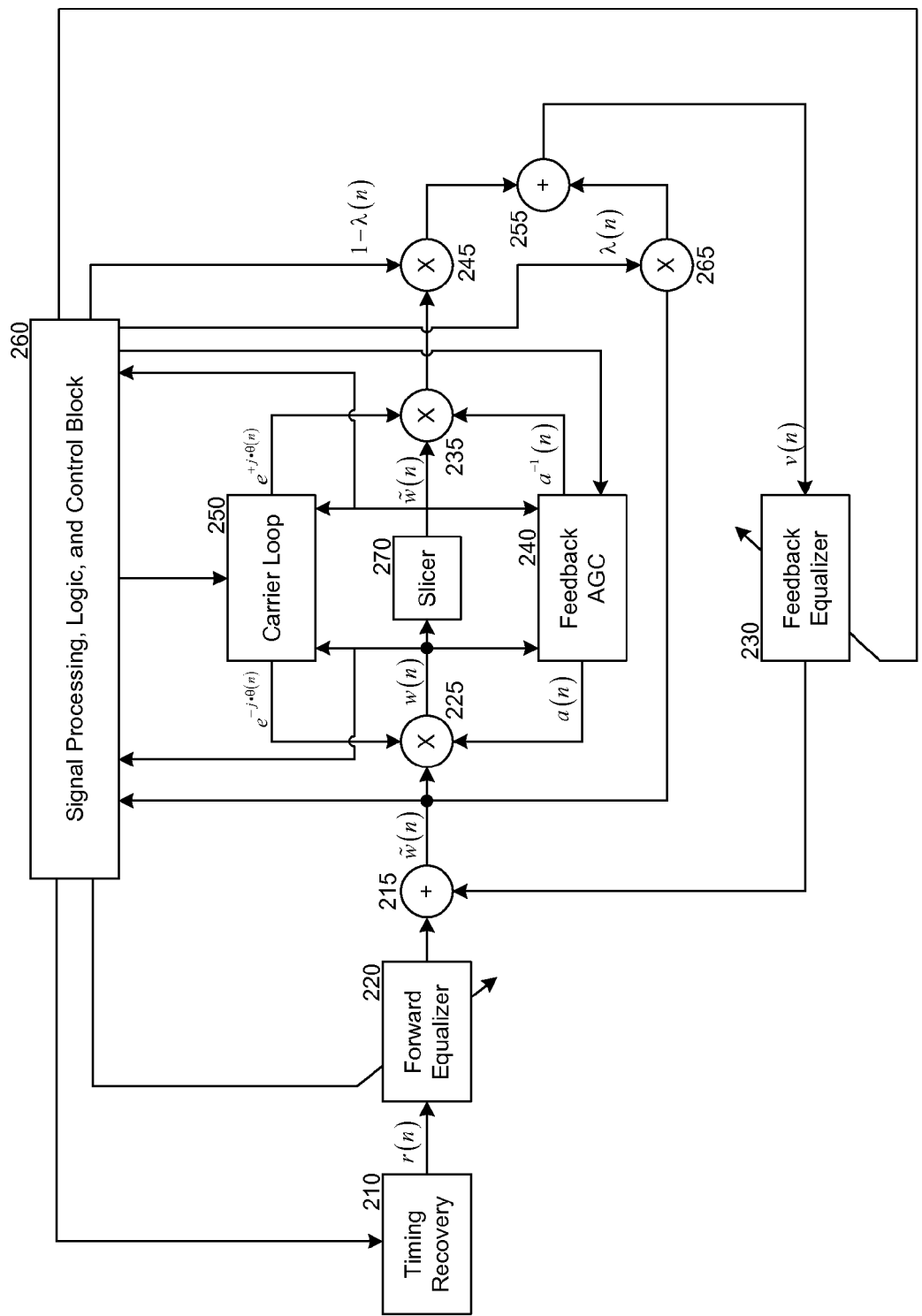
FIG. 2 shows a block diagram of timing recovery, equalization, carrier recovery, and automatic gain control, jointly controlled by a central signal processing block in accordance with certain aspects and embodiments of the present invention.

FIG. 2 shows a block diagram of aspects of one embodiment of the present invention, including a Timing Recovery module 210, Feedback AGC 240, Carrier Recovery Loop 250, two Adaptive Equalizer filters 220 and 230, and a Signal Processing, Logic and Control Block 260. The Slicer 270 is a nearest-element decision device that outputs the point in the QAM source constellation that has closest Euclidean distance to the Slicer's input sample. Alternatively, a partial trellis decoder can be used that exploits channel coding and does not necessarily make nearest-element decisions. Next, we will describe the different operating modes for each of the Timing Recovery, Carrier Recovery, Feedback AGC, and Equalization functions that will be controlled by the Signal Processing, Logic and Control Block 260.

Feedback AGC

A primary goal of the Feedback AGC is to provide quick, robust gain compensation of the signal that is input into the Slicer. This gain compensation may be required as the result of dynamic multipath conditions or flat fades. Though the equalizer itself provides gain compensation of the signal by adjusting the scale of the adaptive filters' coefficients, such compensation can be slow, since a plurality of equalizer coefficients (sometimes hundreds) must move to scale the data appropriately. Therefore, the Feedback AGC provides a single, strictly positive gain value, and is designed to provide gain compensation more quickly than the equalizer is able to do. Two different Feedback AGC architectures are disclosed.

Feedback AGC Preferred Embodiment

The preferred embodiment of the Feedback AGC in the present invention utilizes techniques described in USPTO application No. 60/341,931, entitled "Self-initializing decision feedback equalizer with automatic gain control," by T. J. Endres et al., filed Dec. 17, 2001. These techniques rely on minimization of a specified cost function over the choice of gain value, and are implemented in an adaptive way with a stochastic gradient descent update rule.

The automatic gain control signal $\alpha(n)$ is a real, strictly positive scalar, that is calculated at each baud instance by $$\alpha(n) = \rho_\alpha \alpha(n-1) - \mu_\alpha \frac{\partial J}{\partial \alpha(n-1)}$$

where $\rho_\alpha$ is a leakage factor used in practice to mitigate divergence due to finite-precision effects or quantization noise, and is chosen less than or equal to unity, but close to unity, J is the cost function to be minimized by choice of $\alpha(n)$, and $\mu_\alpha$ is a real-valued, positive stepsize, chosen less than unity, and governs algorithm convergence rate, tracking capabilities, and stochastic jitter.

Different cost functions can be used, and these different cost functions will define different modes of operation that will be controlled by the Signal Processing, Logic and Control Block 260 in FIG. 2.

Operational Mode 1: MSE-Like Cost Function

The first operational mode of the Feedback AGC uses a Mean Squared Error (MSE)-like cost function, expressed as $$J = E\{(|\alpha(n-1) \cdot \tilde{w}(n-1) \cdot e^{-\theta(n)}|^q - |\hat{w}(n-1)|^q)^2\}$$

where q is a positive integer and is set to one for the preferred embodiment. This cost function penalizes the squared difference in magnitudes between the slicer input and output, and is analogous to a mean squared error (MSE) cost function. The partial derivative calculation, denoted as $\tilde{\xi}(n-1) \equiv \partial J/\partial \alpha(n-1)$, assuming correct decisions and neglecting the expectation, for q=1, results in $$\tilde{\xi}(n-1)=[\alpha(n-1)\cdot|\tilde{w}(n-1)|-|\hat{w}(n-1)|]\cdot|\tilde{w}(n-1)|$$

where we have absorbed a factor of two into the stepsize $\mu_\alpha$, and used the fact that sign($\alpha(n-1)$) is always one since the automatic gain control signal is strictly positive by definition.

Since the automatic gain control signal, $\alpha(n)$, is applied to multiplier 225 in FIG. 2 at the current sample instance n, but also requires the use of the output of the multiplier 225 in its calculation, a delay of one sample has been inserted in the calculation of $\tilde{\xi}(n-1)$ and the cost function to keep the system causal.

An alternative embodiment of the present invention uses arbitrary positive integer q in the MSE-like cost function. See USPTO application No. 60/341,931 for a description of the update term for this case.

Operational Mode 2: CM-Like Cost Function

The second operational mode of the Feedback AGC uses a Constant Modulus (CM)-like cost function, expressed as $$J=E\{(|\alpha(n-1)\cdot\tilde{w}(n-1)\cdot e^{-j\theta(n)}|^q-\gamma)^2\}$$

This cost function has the advantage that it does not rely on hard decisions from the output of the Slicer. Letting q=2, taking the partial derivative and neglecting the expectation (as in the previous case for the MSE-like cost function) results in an error term for this cost function expressed as $$\tilde{\xi}(n-1)=\alpha(n-1)\cdot|\tilde{w}(n-1)|^2\cdot(|\alpha(n-1)\cdot\tilde{w}(n-1)|^2-\gamma)$$

The constant $\gamma$ is calculated as $\gamma=E\{|s|^4\}/E\{|s|^2\}$, i.e., analogously to the Godard radius used in adaptation of the equalizer coefficients.

An alternative CM-like cost function uses q=1. The error term from the partial derivative is found as $$\tilde{\xi}(n-1)=|\tilde{w}(n-1)|\cdot(|\alpha(n-1)\cdot\tilde{w}(n-1)|-\gamma)$$

In this case with q=1, the Godard radius is calculated as $\gamma=E\{|s|^2\}/E\{|s|\}$.

Operational Mode 3: Combining of MSE and CM Cost Functions

The third operational mode of the Feedback AGC uses a linear combination of MSE-like and CM-like cost functions. In this case, the error term derived from a MSE-like cost function is weighted by $1-\lambda(n)$, while the error term derived from a CM-like cost function is weighted by $\lambda(n)$, and the results are summed to produce an error term used to update the Feedback AGC gain in the stochastic gradient descent rule. This combining is expressed as $$\tilde{\xi}(n-1)=(1-\lambda(n))\cdot\tilde{\xi}_{MSE}(n-1)+\lambda(n)\cdot\tilde{\xi}_{CM}(n-1)$$

The combining weight $\lambda(n)$ is time-varying and can be chosen among a variety of methods. For example, the combining weight can be set based on the signal-to-noise ratio, error rate, cluster variance, or number of symbols processed. In the preferred embodiment of the present invention, the combining weight is calculated in an adaptive method at each baud instance by the techniques discussed in USPTO application No. 60/341,931, by T. J. Endres et al., entitled "Self-initializing decision feedback equalizer with automatic gain control". Alternatively, the combining weight can be determined from a look-up-table, which is addressed by the array index that is described in the future sections of the present document.

Operational Mode 4: No Update

The fourth operational mode of the Feedback AGC halts adaptation of the Feedback AGC gain value. In this case, the error term is set to zero, $\tilde{\xi}(n-1)=0$, and leakage is set to one, $\pi_\alpha=1$. Hence, the new gain value is equal to the old gain value.

Enhancements: Averaging and Penalty Term

The instantaneous error term $\tilde{\xi}(n-1)$, calculated in accordance with one of the four operational modes previously described, can be averaged before being applied to the stochastic gradient descent update rule to calculate the automatic gain control signal $\alpha(n)$, to induce memory in and reduce the variance of the error signal. For example, the error term used in the stochastic gradient update can be calculated as $$\xi(n-1)=(1-\rho_{age})\cdot\xi(n-2)+\rho_{age}\cdot\tilde{\xi}(n-1)$$

with automatic gain control signal updated by $$\alpha(n)=\rho_\alpha\alpha(n-1)-\mu_\alpha\xi(n-1)$$

where $\rho_{age}$ is chosen greater than or equal to zero, but less than or equal to one, and is a leakage factor. Selecting $\rho_{age}=1$ represents no leakage and induces no memory in the error term. In this case, the error term relies purely on the unity-delayed samples and $\xi(n-1)=\tilde{\xi}(n-1)$.

To reduce undesired interaction between the Equalizer and Feedback AGC, a penalty term can be added to the cost function. This extra term penalizes gain values that are different from a target value, $\Gamma$. For example, the cost function including the penalty term is expressed as $$J+\beta\cdot(\alpha(n-1)-\Gamma)^2$$

where $\beta$ is a small, non-negative weighting factor for the additional penalty term. The automatic gain control value is then updated according to $$\alpha(n)=\rho_\alpha\alpha(n-1)-\mu_\alpha\xi(n-1)-\mu_\alpha\cdot\beta\cdot(\alpha(n-1)-\Gamma).$$

The product $\mu_\alpha\cdot\beta$ can be collapsed into a single value, to ease implementation.

Figure 3:
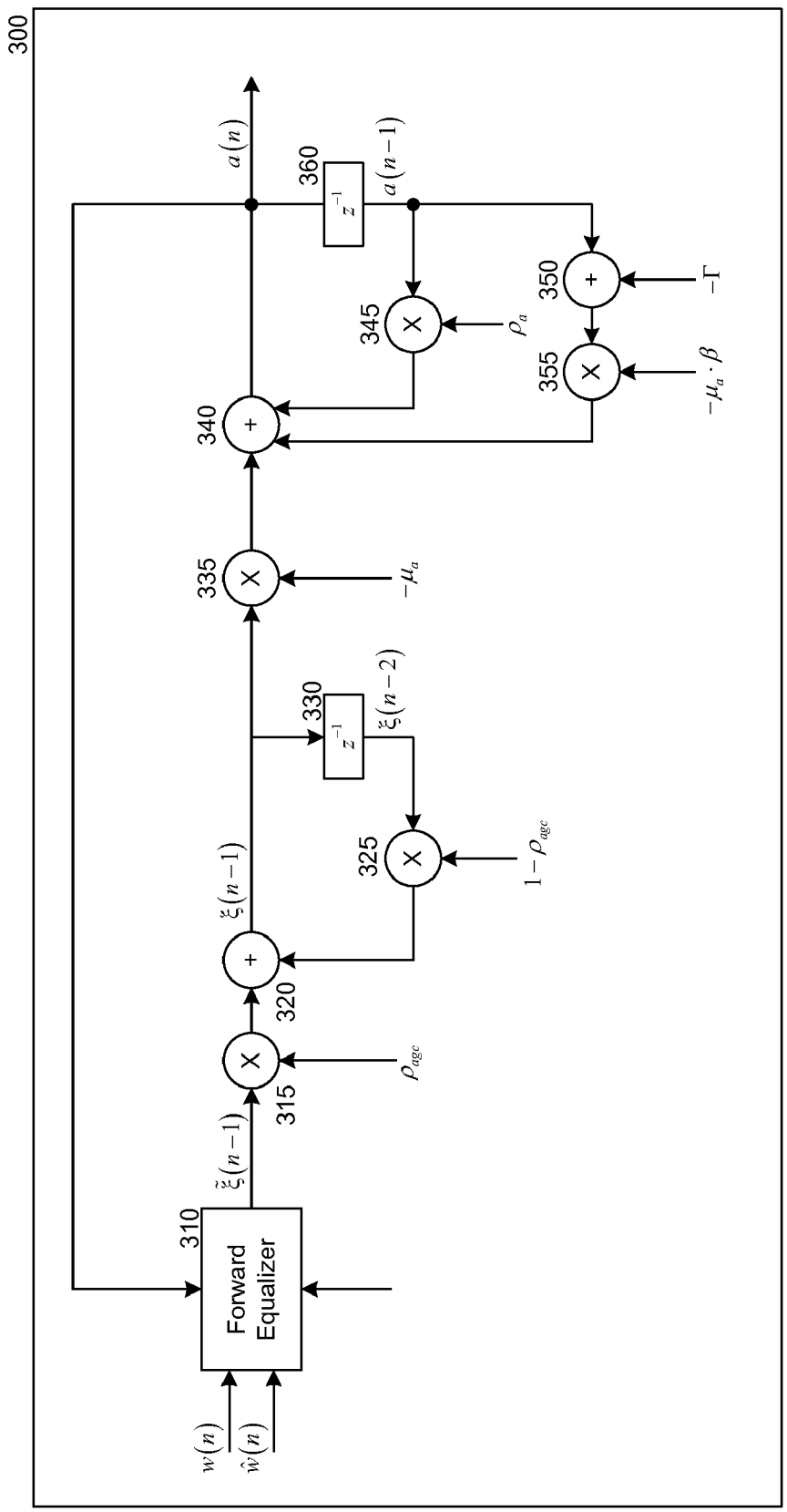
FIG. 3 shows a block diagram of the preferred embodiment of Feedback AGC, showing adaptation of gain value at each symbol instance, and error term selection using control signals in accordance with certain aspects and embodiments of the present invention.

FIG. 3 shows a block diagram of the preferred embodiment of the Feedback AGC in accordance with certain aspects and embodiments of the present invention. Signals w(n) and ŵ(n), the input to the Slicer after derotation and gain scaling, and the Slicer output, respectively, are input to the Error Term Generator 310, as well as the current age gain value, $\alpha(n)$. Error Term Generator 310 calculates an instantaneous error term, $\tilde{\xi}(n-1)$, responsive to the control bits from the Signal Processing, Logic, and Control Block (260 in FIG. 2). The Signal Processing, Logic, and Control Block judges the demodulator's performance and assigns an error term to be used by the Feedback AGC. (We will later see how the adaptation strategy is made completely flexible and programmable by LUT swap in the Signal Processing, Logic, and Control Block.) The four operational modes of the Feedback AGC can be associated with the relative performance of the demodulator, according to, for example,

| Operational Mode (name/number) | Stage of Demodulator Operation |
|---|---|
| CM-like/2 | Initial acquisition or strong dynamic environment |
| Combined CM-like and MSE-like/3 | Secondary acquisition stage or moderate dynamic environment |
| MSE-like/1 | Tracking stage or mild dynamic environment |
| No update/4 | Tracking stage or static environment |

The instantaneous error term $\tilde{\xi}(n-1)$ is applied to a leaky integrator, comprised of multiplier 315, multiplier 325, and delay element 330, to induce averaging. The stepsize $\mu_\alpha$ is applied in multiplier 335 to the averaged error term $\tilde{\xi}(n-1)$. Adder 340 sums the update error term, penalty term, and previous AGC gain value to produce an updated AGC gain value, $\alpha(n)$. Leakage to avoid finite precision effects can be applied in multiplier 345 with leakage factor $\rho_\alpha$ to the previous AGC gain value, $\alpha(n-1)$, supplied by delay element 360. The previous AGC gain value, $\alpha(n-1)$, is also applied to summer 350 where a difference is formed with target threshold $\Gamma$. This result is multiplied by the weighting factor $-\mu_\alpha \cdot \beta$ in multiplier 355. The updated AGC gain value from adder 340, $\alpha(n)$, is also fed back to the Error Term Generator 310 to form the next instantaneous error term.

Feedback AGC Alternative Embodiment

An alternative embodiment of the Feedback AGC uses a bandpass control loop to adjust the AGC gain value. The bandpass characteristic is designed so that the rise (or attack) time of the Feedback AGC is very fast (about a few symbol periods) compared to the decay time of the Feedback AGC (hundreds or thousands of symbol periods). The gain value of the Feedback AGC decays to a prescribed threshold, nominally unity, as time goes to infinity. Hence, in a dynamic environment the overall gain of the received signal is quickly adjusted by the Feedback AGC and seamlessly transferred to the Equalizer.

Figure 4:
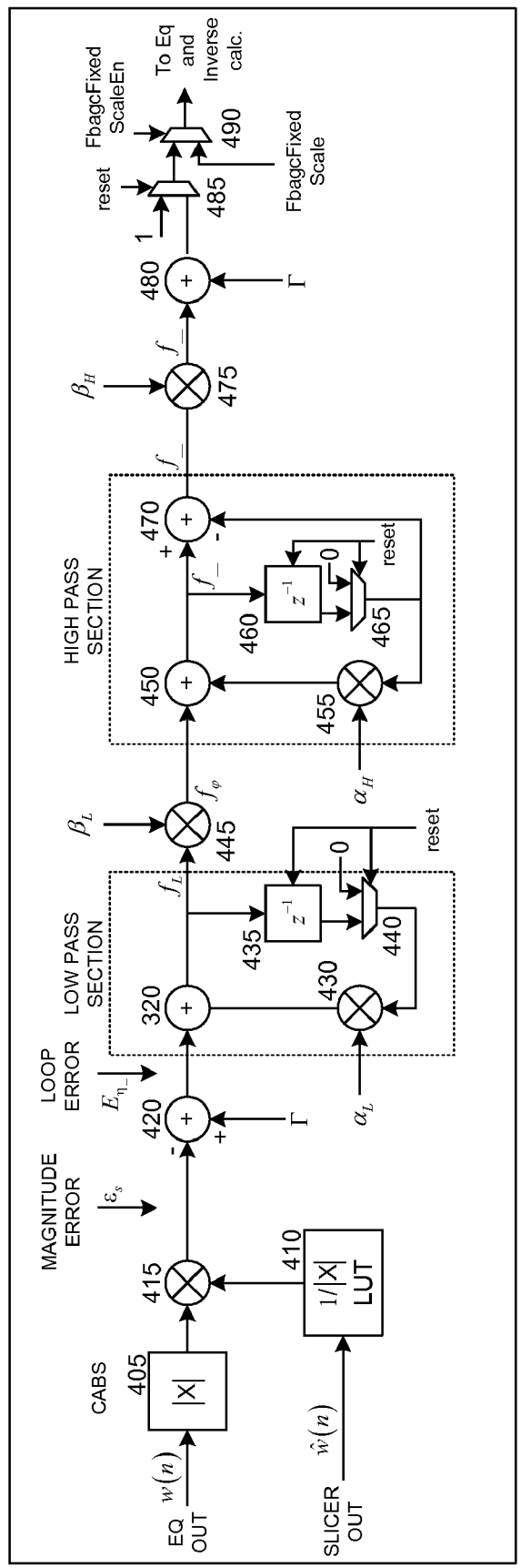
FIG. 4 shows a block diagram of alternative embodiment of Feedback AGC, showing error term generation, and bandpass filtering using cascaded low-pass and high-pass filter sections, in accordance with certain aspects and embodiments of the present invention.

FIG. 4 shows a block diagram of this alternative embodiment of the Feedback AGC in accordance with certain aspects and embodiments of the present invention. The loop is configured as a second order control loop with zero response at DC. The loop is sampled at the symbol rate.

The control loop derives the gain value from an error penalizing the difference of the ratio of the magnitudes of soft to hard decisions from a target value, for example, unity. The complex magnitude (square root of sum of real and imaginary components squared) of the equalizer output sample, w(n), is calculated in the CABS block 405. Look-up-table 410 stores inverse magnitudes of constellation points, and is addressed using the hard decision samples, $\hat{w}(n)$, or indices associated with these hard decision samples, coming from the Slicer. Multiplier 415 forms the ratio of magnitudes of soft to hard decision samples, and this is termed the magnitude error and denoted as $$\varepsilon_s(n) = \frac{|w(n)|}{|\hat{w}(n)|}$$

Adder 420 takes the difference of the magnitude error from a target threshold, F, nominally unity, and forms the loop error, denoted as $$E_{sym}(n) = (\Gamma - \epsilon_s(n))$$

The loop error, $E_{sym}(n)$, is first filtered by a low pass section that has transfer function $$H(z) = \frac{\beta_L}{(1 - \alpha_L z^{-1})}.$$

Adder 425 sums the loop error $E_{sym}(n)$ with a delayed and scaled version of the low pass output. Delay element 435 delays the low pass signal $f_L$. Control signal reset is used to clear the contents of delay element 435 and output a zero-value from mux 440 instead of the output of delay 435. The output of mux 440 is multiplied with low pass scale $\alpha_L$ in multiplier 430. Low pass scale $\alpha_L$ is used to set the breakpoint of the low pass filter section. The output of multiplier 430 is summed with the input to the low pass section in adder 425. The low pass signal $f_L$ is scaled by low pass gain, $\beta_L$, in multiplier 445, producing the output of the low pass section, $f_{L\beta}$, also used as the input to the high pass section.

The high pass section has transfer function $$H(z) = \frac{\beta_H \cdot (1 - z^{-1})}{(1 - \alpha_H z^{-1})}.$$

Signal $f_{L\beta}$ is summed with a delayed and scaled version of signal $f_{hint}$ in adder 450, producing signal $f_{hint}$. Signal $f_{hint}$ is delayed in delay element 460. Control signal reset is used to clear the contents of delay element 460 and output a zero-value from mux 465 instead of the output of delay element 460. The output of mux 465 is multiplied with high pass scale $\alpha_H$ in multiplier 455. High pass scale $\alpha_H$ is used to set the breakpoint of the high pass filter section. The output of mux 465 is also subtracted from signal $f_{hint}$ in adder 470, producing high pass signal $f_h$. High pass signal $f_h$ is scaled by high pass gain, $\beta_H$, in multiplier 475, producing the high pass output signal, $f_{H\beta}$.

The high pass output $f_{H\beta}$ is added back to the target threshold, $\Gamma$, in adder 480, producing the calculated Feedback AGC gain value. Upon reset, however, mux 485 selects a unity-valued gain signal instead of the calculated AGC gain value. Using control signal FbagcFixedScaleEn, mux 490 sets the AGC gain value to programmable gain value FbagcFixedScale instead of the calculated gain value.

For a baud rate of approximately 613 KHz, nominal gain and scale values can be set to:

| $\alpha_L$ | $\alpha_H$ | $\beta_H$ | $\beta_L$ |
|---|---|---|---|
| 0.999 | 0.999 | 0.03 | 1.0 |

The Signal Processing, Logic and Control Block 260 in FIG. 2 controls this alternative embodiment of the Feedback AGC in accordance with certain aspects and embodiments of the present invention by selecting between one of the following operational modes at each baud instance.

Operational Mode 1: Decision Directed

When the Feedback AGC is operated in a decision directed (DD) mode, the magnitude error is found as $$\varepsilon_s(n) = \frac{|w(n)|}{|\hat{w}(n)|}$$

and the filtering is as described above for FIG. 4.

Operational Mode 2: Freeze

When the Feedback AGC is operated in a Freeze mode, the system clocking of the circuit in FIG. 4 is disabled, so that all memory contents, including the output AGC gain value, remain unchanged. Effectively, this circuit is bypassed, and there is no change to the internal state.

Operational Mode 3: Fixed Scale

When the Feedback AGC is in Fixed Scale mode, all internal calculations are performed. However, mux 490 in FIG. 4 replaces the calculated gain value with the value of the programmable register FbagcFixedScale.

Operational Mode 4: Reset

When the Feedback AGC is in Reset mode, the accumulators 435 and 460 are set to zero, mux's 440 and 465 output a zero-valued sample, and mux 485 outputs a unity-valued sample for the AGC gain value.

Carrier Loop

The goal of the final stage of carrier recovery is to translate the received signal to precise baseband in the synchronous demodulator. A precise baseband signal is needed to form hard decision samples, or symbol estimates, in the Slicer. A Carrier Recovery loop is used to track out any residual carrier frequency or phase offset, and phase noise introduced in the demodulation process. In FIG. 2, the conjugated output $e^{-j \cdot \theta(n)}$ of the Carrier Loop 250 is used to de-rotate the passband Equalizer output to precise baseband in multiplier 225, while the output $e^{-j \cdot \theta(n)}$ of the Carrier Loop 250 is used to re-rotate the baseband Slicer output to passband in multiplier 235.

Figure 5:
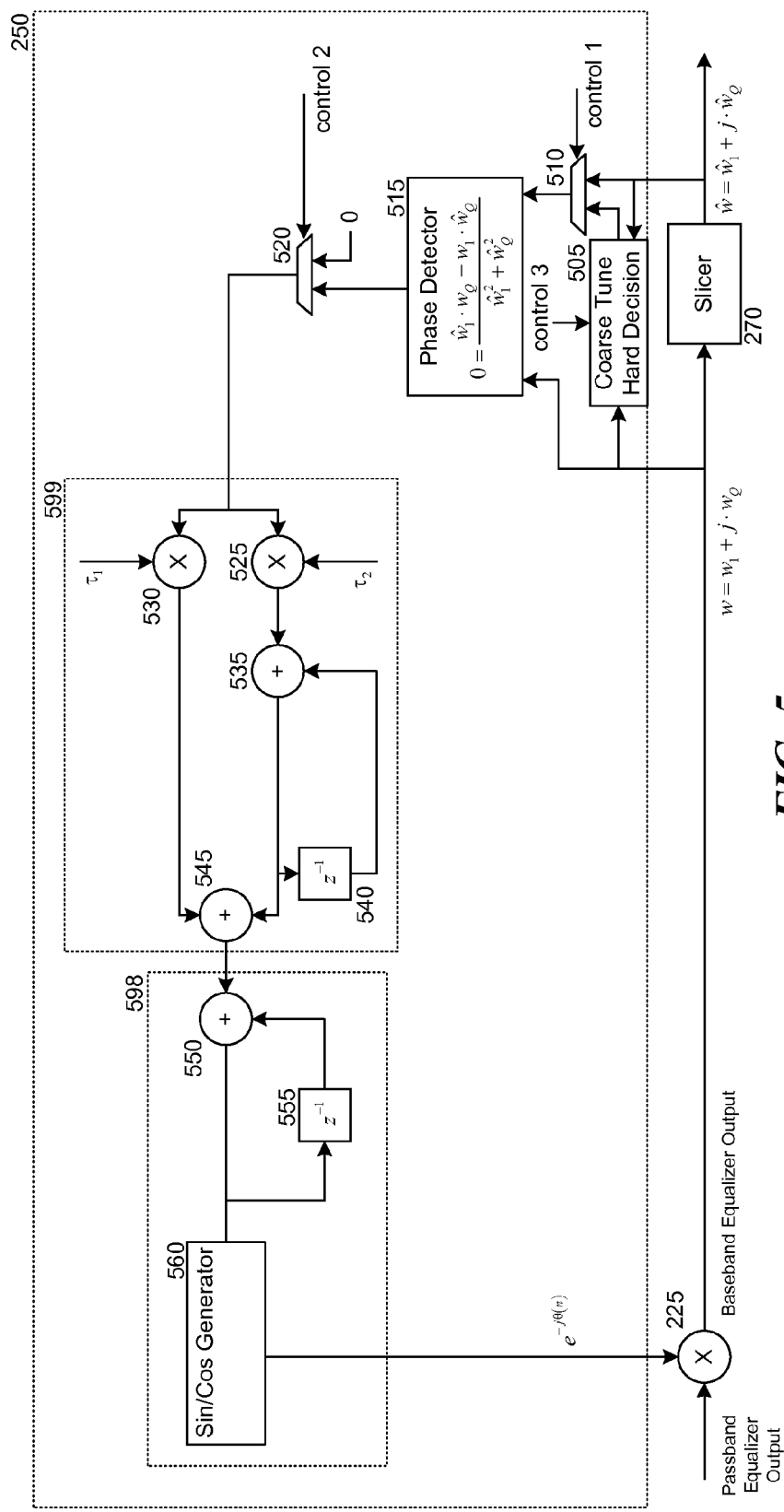
FIG. 5 shows a block diagram of Carrier Loop nested with Equalizer and Slicer, used to translate the received signal to precise baseband.

The Carrier Loop 250 is described in more detail in FIG. 5. This carrier loop uses a decision-directed (DD) phase error in a second order, (digital) phase locked loop with a numerically-controlled oscillator (NCO) to produce the sin and cosine terms needed to perform the de-rotation and re-rotation of Equalizer and Slicer outputs, respectively.

Decision-directed phase and frequency recovery is discussed in the textbook by Lee and Messerchmitt, entitled *Digital Communication*, Appendix 17-B, Kluwer Academic Publishers, Norwell, Mass., Second Edition, 1994, which is incorporated by this reference.

In FIG. 5, the baseband equalizer output, $w=w_I+j \cdot w_Q$ is supplied as input to Slicer 270, and also to Coarse Tune Hard Decision Block 505. This block is not discussed in Lee and Messerchmitt, and is used in certain aspects and embodiments of the present invention. Coarse Tune Hard Decision Block 505 provides an alternative hard decision sample than the one supplied by the Slicer, a nearest-element decision device. The alternative hard decision samples can be used in more of an acquisition state, while the hard decision samples from the Slicer are generally more reserved for tracking or steady-state demodulator operation. Coarse Tune Hard Decision Block 505 can be configured in various operating modes to produce alternative hard decision samples.

Coarse Tune Hard Decision Operating Mode 1, Linear Combination of Soft and Hard:

In this preferred embodiment of the Coarse Tune Hard Decision Block 505, the alternative hard decision sample, $\hat{w}_A$, is formed by taking linear combinations of soft decision samples from the equalizer and hard decision samples from the Slicer, $$\hat{w}_A = (1-\lambda) \cdot w + \lambda \cdot \hat{w}$$

where the real-valued combing weight $\lambda$ is greater than or equal to zero but less than or equal to unity, and is selected adaptively. Methods to determine the combining weight are described in U.S. Ser. No. 60/341,931, entitled "Self-initializing decision feedback equalizer with automatic gain control," by T. J. Endres et al., filed Dec. 17, 2001, which is incorporated by reference, and will also be described in the sequel.

Coarse Tune Hard Decision Operating Mode 2, Quadrant Mapping:

An alternative embodiment of the present invention uses Quadrant Mapping of the soft decision sample. The basic goal of generating an alternative hard decision sample using Quadrant Mapping is to estimate the quadrant in I/Q space in which the soft decision sample belongs, and scale the sample depending on the modulation format. This simple operation is expressed by selecting the alternative hard decision sample, $\hat{w}_A$, according to $$\hat{w}_A = \Delta \cdot (\text{sign}(w_I) + j \cdot \text{sign}(w_Q))$$

where $\Delta$ is a real-valued, positive scalar that can be selected according to the modulation format.

Coarse Tune Hard Decision Operating Mode 3, Reduced Constellation:

Certain alternative embodiments of the present invention quantize the soft decision sample not to the nearest element of the source alphabet (as the Slicer does), but to the nearest element of a subset of the source alphabet. This is referred to as a reduced constellation since only part of the source constellation is used to generate the alternative hard decision sample.

Coarse Tune Hard Decision Operating Mode 4, Reduced Precision:

Suppose that the baseband soft decision sample, w, is represented by M bits, while the Slicer's hard decision sample needs only N bits to be exactly represented, with M>N. An alternative hard decision sample is found by rounding and saturating the end points of the soft decision sample, to a bit-width P, where M>P>N. For example, suppose the soft decision sample is represented by M=16 bits, but only N=7 bits are needed to precisely represent the Slicer hard decision sample on the constellation grid. Then an alternative hard decision sample can be found by formatting the soft decision down to P=9 or P=10 bits.

Coarse Tune Hard Decision Operating Mode 5, Arbitrary Nonlinearity:

The Coarse Tune Hard Decision Block 505 can also generate alternative hard decision samples according to an arbitrary nonlinear curve, without memory. For example, a hyperbolic tangent curve can be approximated.

These operating modes are selected using input signal "control 3" to Coarse Tune Hard Decision Block 505. Input signal "control 3" is supplied from the Signal Processing, Logic, and Control Block (260 in FIG. 2) at each baud instance in accordance with certain aspects and embodiments of the present invention.

The alternative hard decision sample that is output from The Coarse Tune Hard Decision Block 505 in FIG. 5 is supplied to mux 510. Mux 510 selects which hard decision sample is supplied to the Phase Detector 515, from among the hard decision sample from the Slicer and the alternative hard decision sample from the Coarse Tune Hard Decision Block 505. Mux 510 is controlled by input signal "control 1" that is supplied from the Signal Processing, Logic, and Control Block (260 in FIG. 2) at each baud instance in accordance with certain aspects and embodiments of the present invention.

The Phase Detector 515 derives an instantaneous estimate of the phase error between soft and hard decisions, and is described in Lee and Messerchmitt, *Digital Communication*, Appendix 17-B, Kluwer Academic Publishers, Norwell, Mass., Second Edition, 1994, which is incorporated by reference. Using a small angle approximation, the phase error estimate is calculated according to $$\phi = \frac{\hat{w}_I \cdot w_Q - w_I \cdot \hat{w}_Q}{\hat{w}_I^2 + \hat{w}_Q^2}$$

where $w = w_I + j \cdot w_Q$ is the baseband soft decision sample, and $\hat{w} = \hat{w}_I + j \cdot \hat{w}_Q$ is the hard decision sample supplied from mux 510. In practice, the denominator is sometimes omitted.

For the preferred embodiment of the Coarse Tune Hard Decision Block 505, using Operating Mode 1, the hard decision sample used in the phase error calculation is the weighted sum of soft decision samples from the Equalizer and hard decision samples from the Slicer, using adaptive combining weight λ. When λ=0, signal quality is very good, and the instantaneous phase estimate is calculated with a hard decision sample that is equal to the Slicer hard decision sample, as intended in Lee and Messerchmitt, *Digital Communication*, Appendix 17-B, Kluwer Academic Publishers, Norwell, Mass., Second Edition, 1994. However, when λ=1 and signal quality is poor, the instantaneous phase estimate, φ, collapses to zero, which corresponds to no update to the phase and frequency produced by the PLL. In an acquisition state of the demodulator, when signal quality is poor, and hard decision samples are more unreliable, it is desirable to halt adjustment of frequency and phase that could slow or event prevent convergence of the loop. Hence, adaptively combining soft decisions from the Equalizer and hard decisions from the Slicer, the PLL is automatically transitioned among acquisition and tracking states, and halted (or slowed) when signal quality worsens and its inputs become unreliable.

The output of Phase Detector 515 is supplied to mux 520. Mux 520 selects from among Phase Detector 515 output or a zero-value. Mux 520 is controlled by signal "control 2", that is supplied from the Signal Processing, Logic, and Control Block (260 in FIG. 2) at each baud instance in accordance with certain aspects and embodiments of the present invention.

The output of Mux 520 is supplied to Loop Filter 599. Multiplier 530 applies proportional control by multiplication with $\tau_1$, a programmable real-valued scalar, while multiplier 525 applies integral control by multiplication with $\tau_2$, a programmable real-valued scalar. The output of multiplier 525 is then integrated in adder 535 and delay element 540. The output of adder 535 is the integral control, and is summed in adder 545 with the proportional control from multiplier 530. Adder 545 supplies the Loop Filter 599 output to the NCO 598.

Numerically-controlled oscillator (NCO) 598 integrates the signal from adder 545 (Loop Filter 599 output) in adder 550 and delay element 555. The output of adder 550, representing instantaneous phase of the desired sinusoid, is supplied to a Sin/Cos Generator 560. Sin/Cos Generator 560 uses prior art techniques, such as LUT storage of sinusoid, in whole or part, or direct calculation of approximation by Taylor (or other) series, for example, to provide sine and cosine terms. These sine and cosine terms are used to de-rotate the Equalizer soft decision sample by $e^{-j \cdot \theta(n)}$, and also to re-rotate the Slicer hard decision sample by $e^{+j \cdot \theta(n)}$.

Equalization

Figure 6:
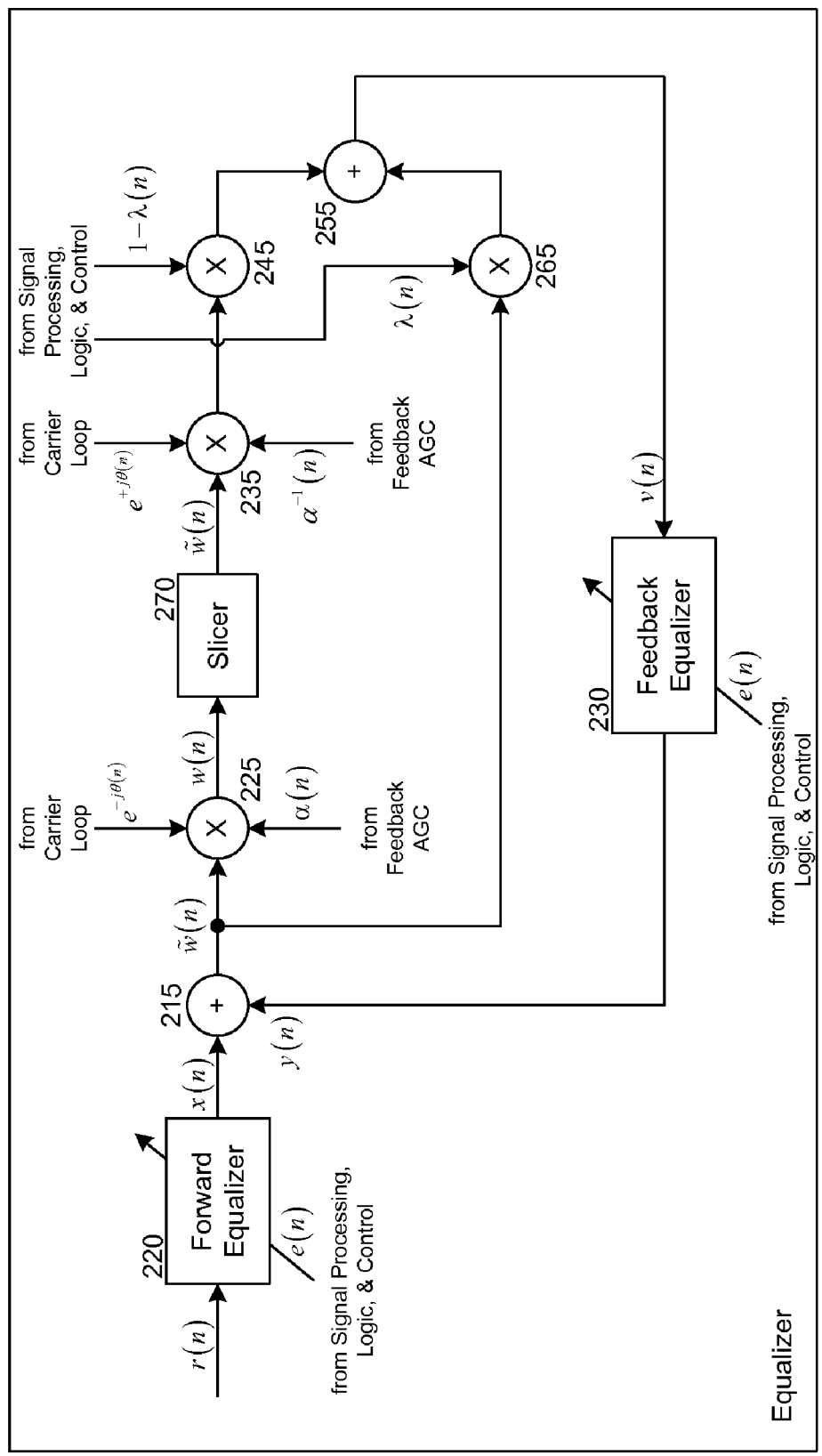
FIG. 6 shows a block diagram of Decision Feedback Equalizer (DFE) in accordance with certain aspects and embodiments of the present invention.

One preferred embodiment of the Equalizer portion of the present invention is extracted from FIG. 2 and drawn in FIG. 6. This equalizer architecture is a Decision Feedback Equalizer (DFE) with both forward and feedback filters operating in the passband, that uses prior art techniques described in U.S. Ser. No. 60/341,931, entitled "Self-initializing decision feedback equalizer with automatic gain control," by T. J. Endres et al., filed Dec. 17, 2001 which is incorporated by reference.

In FIG. 6, the received signal, r(n), is a passband sample that is supplied from Timing Recovery Block 210 in FIG. 2. Forward filter 220 may operate at the baud rate or faster, in which case the equalizer is said to be fractionally-spaced, and exploits temporal diversity. Also, the forward filter 220 may receive multiple inputs, as from multiple antennas, to exploit spatial diversity. Temporal or spatial diversity use a multi-channel forward filter. For simplicity, however, a single forward filter 220 is shown, and extension to a multi-channel model is understood by one skilled in the art.

Forward filter 220 is a finite impulse response (FIR) filter, computing its output according to the convolution sum $$x(n) = f_0(n) \cdot r(n) + f_1(n) \cdot r(n-1) + f_2(n) \cdot r(n-2) + \ldots + f_{L_f-1}(n) \cdot r(n-L_f+1)$$

where r(n) is the sample sequence input to forward filter 220, x(n) is the output sample sequence of forward filter 220, $f_i$ are the forward filter coefficients (or parameters,) and $L_f$ is the number of forward filter coefficients. Note that the forward filter coefficients are also shown with time index n to indicate that the forward filter 220 is adaptive.

The feedback filter 230 is not multi-channel, and is a FIR filter that calculates its output according to the convolution sum $$y(n) = g_0(n) \cdot v(n) + g_1(n) \cdot v(n-1) + g_2(n) \cdot v(n-2) + \ldots + g_{L_g-1}(n) \cdot v(n-L_g+1)$$

where v(n) is the sample sequence input to feedback filter 230, y(n) is the output sample sequence of feedback filter 230, $g_i$ are the feedback filter coefficients (or parameters,) and $L_g$ is the number of feedback filter coefficients. Note that the feedback filter coefficients are also shown with time index n to indicate that the feedback filter 230 is adaptive. Though the feedback filter 230 is a FIR filter, it is embedded in a feedback loop, so that the equalizer has an overall impulse response that is infinite.

Adaptation of the forward filter 220 coefficients and feedback filter 230 coefficients uses a stochastic gradient descent update rule:

$$f_i(n+1) = f_i(n) - \mu_f \cdot \chi^*(n) \cdot e(n)$$

$$g_i(n+1) = g_i(n) - \mu_g \cdot \phi^*(n) \cdot e(n)$$

where (•)* represents complex conjugation, and $\mu_f$ and $\mu_g$ are small, positive stepsizes governing algorithm convergence rate, tracking capabilities and stochastic jitter. Using simplified updates, the data used in the adaptation equations are set to $\chi(n) = r(n)$ and $\phi(n) = v(n)$. The error term, e(n), depends on the operating mode of the Equalizer and is controlled by the Signal Processing, Logic and Control Block 260 (in FIG. 2). The various operating modes will be discussed later in this section. Setting $\chi(n) = r(n)$ and $\phi(n) = v(n)$ in these equations used to adapt forward filter 220 and feedback filter 230 coefficients is referred to as "simplified updates," since the step known as regressor filtering is omitted. True cost function minimization requires an extra stage of filtering for the regressor data of the forward filter 220 and the feedback filter 230 in the adaptation process, using the current equalizer coefficients. Such regressor filtering is often omitted in practice to ease implementation. Regressor filtering is described in Chapter 5 of "Theory and design of adaptive filters" by J. R. Treichler, C. R. Johnson, Jr., and M. G. Larimore, Prentice Hall, 2001 which is incorporated by reference. One skilled in the art would recognize how to modify the regressor data used in the adaptation equations above to incorporate the extra stage of regressor filtering.

Adder 215 combines the outputs of forward filter 220 and feedback filter 230, x(n) and y(n), respectively, to form sample sequence $\tilde{w}(n)$. Sample sequence $\tilde{w}(n)$ is referred to as passband soft decision samples. Multiplier 225 applies de-rotation from the Carrier Loop 250 by $e^{-j\cdot\theta(n)}$ and gain scaling from the Feedback AGC 240 by $\alpha(n)$. The output of multiplier 225 is denoted w(n) and referred to as baseband soft decision samples. These basband soft decision samples are input to Slicer 270. Slicer 270 is a nearest-element decision device that outputs a hard decision, $\hat{w}(n)$, corresponding to the source alphabet member with closest Euclidean distance to its input sample. The hard decisions, $\hat{w}(n)$, from slicer 270 are re-rotated to the passband by application of Carrier Loop 250 signal $e^{+j\cdot\theta(n)}$, and re-scaled by Feedback AGC 240 signal $\alpha^{-1}(n)$ in multiplier 235.

The output of multiplier 235 is weighted by $1-\lambda(n)$ in multiplier 245, and the signal $\tilde{w}(n)$ is weighted by $\lambda(n)$ in multiplier 265. Signals $1-\lambda(n)$ and $\lambda(n)$ are real-valued, adaptive combining weights provided by Signal Processing, Logic, and Control Block 260 (in FIG. 2) and are greater than or equal to zero, but less than or equal to unity. The weighted signals from multipliers 245 and 265 are summed in adder 255 to form feedback sample v(n), used as input data to feedback filter 230.

The operational mode of the Equalizer is determined by error term, e(n), whose selection is governed by the Signal Processing, Logic, and Control Block 260 (in FIG. 2). These operational modes are next described.

Operational Mode 1: LMS

The Least Mean Squares (LMS) algorithm minimizes a Mean Squared Error (MSE) cost function that penalizes the squared difference between source sequence s(n) (in FIG. 1) from the transmitter, and Equalizer output w(n). In practice, the Receiver 150 in FIG. 1 stores or derives a replica of a training sequence, and the trained LMS algorithm uses error term $e_{lms}(n)=(w(n)-s(n))\cdot e^{+j\cdot\theta(n)}$ so that e(n) is set to $e_{lms}(n)$. The baseband error term is re-rotated back to passband by multiplying the baseband error term with the sine and cosine terms from Carrier Loop 250. The training sequence is usually periodically resent, wasting valuable bandwidth.

In the absence of a training sequence, the output of Slicer 270 is used instead. Replacing s(n) with $\hat{w}(n)$ in the LMS error term is called Decision Directed (DD) LMS and uses the error term $e_{lms}(n)=(w(n)-\hat{w}(n))\cdot e^{+j\cdot\theta(n)}$ so that e(n) is set to $e_{lms}(n)$.

When this operational mode is selected, training sequence data is used in the LMS calculation; else, hard decision samples are used in the LMS calculation. It is understood that modifications to these LMS error terms, using MSE techniques, to suit the specific application, are obvious to one skilled in the art.

Operational Mode 2: CMA

The Constant Modulus Algorithm (CMA) minimizes the Constant Modulus (CM) cost function and calculates an error term without the use of a training sequence. Hence, it is classified as a blind algorithm. The CM criterion penalizes the dispersion of the magnitude squared of the equalizer output sample from a predetermined scalar. The preferred embodiment of the present invention calculates the CMA error term according to $e_{cma}(n)=\tilde{w}(n)\cdot(|\tilde{w}(n)|^2-\gamma)$ where $\gamma$ is a predetermined, real-valued scalar referred to as the Godard radius, or dispersion constant, and is usually determined from the source alphabet as $\gamma=E\{|s(n)|^4\}/E\{|s(n)|^2\}$. Notice that the passband soft decision sample $\tilde{w}(n)$ is used in the CMA error term calculation, so that there is no multiplication required with sine and cosine terms. This sample is prior to Feedback AGC gain scaling in multiplier 225 (FIG. 6). The inventors have determined that the use of soft decision sample prior to gain scaling in the CMA error term calculation reduces undesirable interaction between Equalizer 220 and Feedback AGC 240, compared to using the soft decision sample after gain scaling. In this case, e(n) is set to $e_{cma}(n)$.

An alternative embodiment of the present invention calculates the CMA error term according to $e_{cma}(n)=w(n)\cdot(|w(n)|^2-\gamma)\cdot e^{+j\cdot\theta(n)}$ In this case, e(n) is set to $e_{cma}(n)$.

These CMA error terms described are of order 2, as described by Godard. It is understood that modifications to these CMA error terms, using constant modulus techniques, to suit the specific application, are obvious to one skilled in the art. Furthermore, related Bussgang techniques, as summarized in chapter 2 of "Blind Deconvolution," Prentice Hall, written by S. Bellini, edited by S. Haykin, 1994, which work is incorporated by this reference, are generalizations of constant modulus techniques, and can be substituted for the described CMA error terms by one skilled in the art.

Operational Mode 3: Combined LMS and CMA

Using the adaptive combing weights $1-\lambda(n)$ and $\lambda(n)$ provided by Signal Processing, Logic, and Control Block 260 (in FIG. 2), a combined error term is calculated according to $e(n)=\lambda(n)\cdot e_{lms}(n)+(1-\lambda(n))\cdot e_{cma}(n)$.

Operational Mode 4: Halt Adaptation

In this operational mode, the equalizer coefficients remain unchanged, so that the error term is $e(n)=0$.

The error terms described above are for the Equalizer in FIG. 6 that has adaptive filters which operate in the passband. It is understood that modifications to these error terms for equalizer architectures with adaptive filters in the baseband, or for equalizer architectures with some adaptive filters operating in passband and others in baseband, are obvious to one skilled in the art.

Timing Recovery

The purpose of the Timing Recovery Loop (170 in FIG. 1) is to adjust the sampling phase and frequency of the received data. When the sampling epochs are adjusted to correspond to top-dead-center of the pulse shape, no ISI is introduced from neighboring symbols, since the pulse shape (for example, a square root raised cosine filter) is usually designed to be zero-valued at integer multiples of the baud rate.

Figure 7:
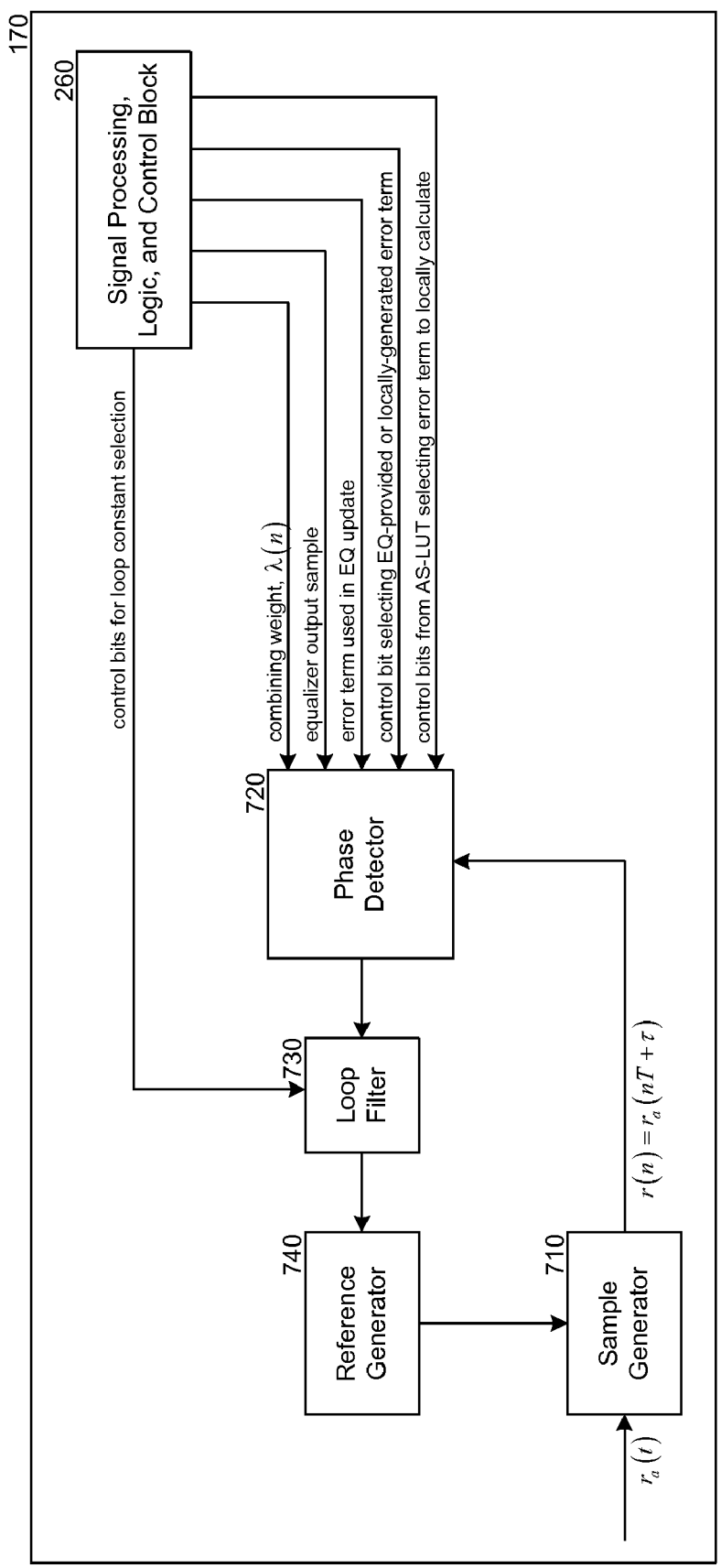
FIG. 7 shows a block diagram of Timing Recovery Loop and its control by Signal Processing, Logic, and Control Block in accordance with certain aspects and embodiments of the present invention.

To adjust the sampling epoch, most systems either adjust the sampling phase and frequency of the analog-to-digital converter (ADC), or interpolate the sampled data somewhere in the signal processing chain. FIG. 7 captures both of these approaches in a block diagram of Timing Recovery Loop 170 interfaced with Signal Processing, Logic, and Control Block 260 in accordance with certain aspects and embodiments of the present invention.

In FIG. 7, the received analog data $r_\alpha(t)$ is sampled in Sample Generator 710, producing sampled data sequence $r(n)=r_\alpha(nT+\tau)$, where T is the sampling period and $\tau$ is the sampling phase. Sample Generator 710 may include an ADC with sampling period and phase that are adjusted by a clock provided by Reference Generator 740. Alternatively, Sample Generator 710 may include an ADC that samples data with a free-running clock, followed by a digital interpolator that is controlled by Reference Generator 740, for example, using a Numerically Controlled Oscillator (NCO).

Phase Detector 720 receives the sampled data r(n), and computes a phase error responsive to signals from the Signal Processing, Logic and Control Block 260 in accordance with certain aspects and embodiments of the present invention. Loop Filter 730 uses proportional and integral control to filter high-frequency signal components and integrate the phase error for sampling frequency adjustment. The Reference Generator 740 uses the loop error signal from Loop Filter 730 to provide control signals for sampling frequency and phase adjustment in Sample Generator 710.

Figure 8:
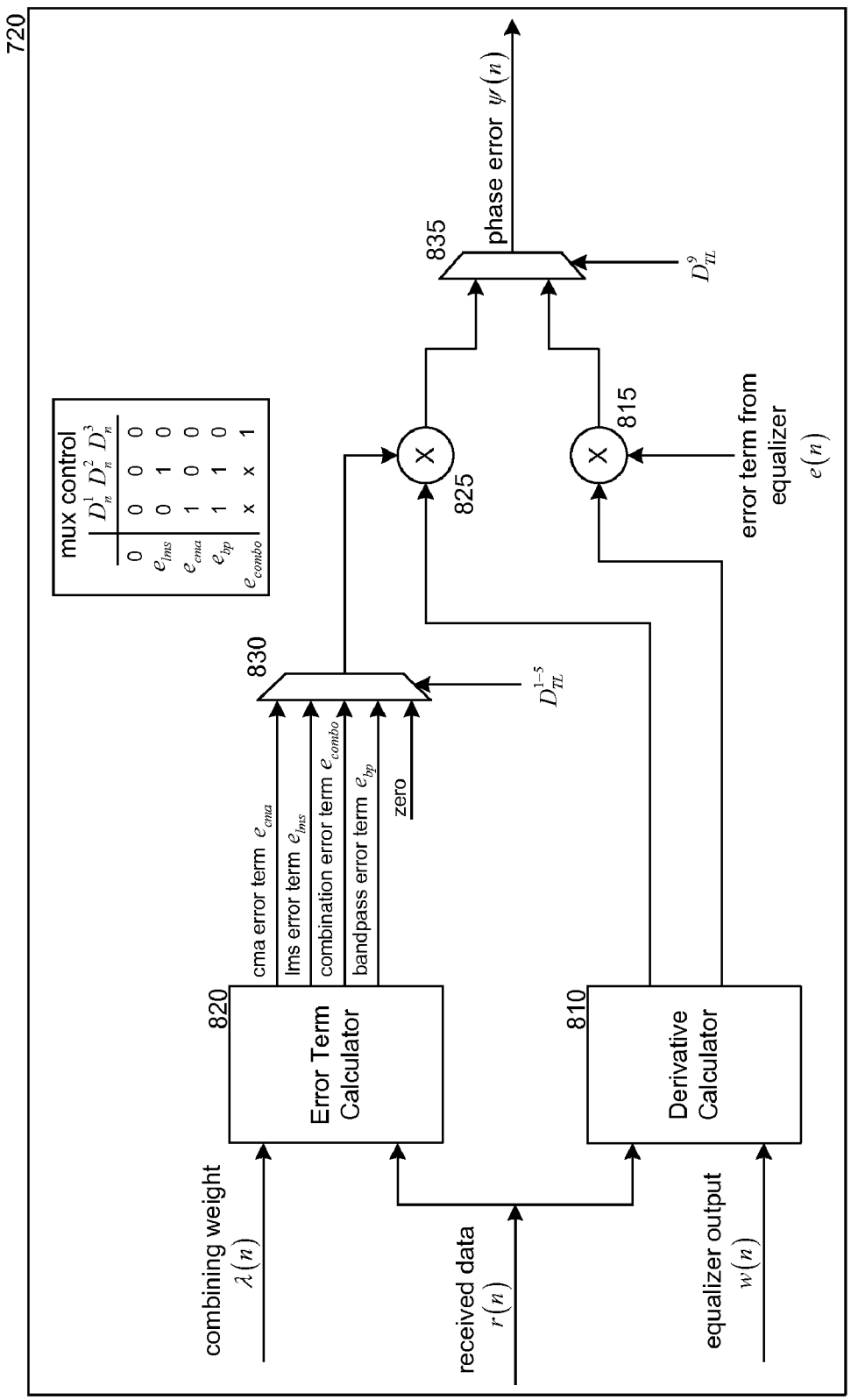
FIG. 8 shows a Phase Detector for Timing Recovery Loop and its control by the Signal Processing, Logic, and Control Block.

In accordance with certain aspects and embodiments of the present invention, the operating mode of the Timing Recovery Loop 170 is determined from the signals provided by the Signal Processing, Logic, and Control Block 260 by selecting the criterion by which the phase error signal is calculated in the Phase Detector 720. FIG. 8 shows a block diagram of the logic in Phase Detector 720 using the control signals provided by the Signal Processing, Logic, and Control Block 260 to calculate a phase error signal $\psi(n)$. The details of this block diagram will be apparent as the operating modes of Timing Recovery Loop 170 are discussed.

Operating Mode 1: Band Edge

Band edge timing recovery methods are prior art techniques basically based on the maximization of Signal to Noise Ratio (SNR) of sampler output. Band edge timing recovery schemes such as in U.S. Pat. No. 5,872,815 by C. Strolle et al, entitled "Apparatus for generating timing signals for a digital receiver," which is incorporated by this reference, are implemented in pass band by exploiting the band edges of the data spectrum in order to obtain the timing phase maximizing the sampler output energy.

Phase Detector 720 computes the base band equivalent band edge timing phase error signal by differentiating the following base band output energy cost function $$\frac{\partial J_{OEM}(r, \tau)}{\partial \tau} = e_{TL}(n) \frac{\partial r(\tau)}{\partial \tau}$$

where $e_{TL}(n)$ is an error term (in this case derived from r(n)) and $$\frac{\partial r}{\partial \tau}$$

is approximated in a variety or prior art methods, for example, using FIR filters in Lee and Messerchmitt, *Digital Communication*, Appendix 17-B, Kluwer Academic Publishers, Norwell, Mass., Second Edition, 1994 which is incorporated by reference.

With the cost function defined as $$J_{OEM}(r, \tau) = \frac{1}{2}|r(\tau)|^2$$

the band-edge phase error is $$e_{TL}(n)=r(n).$$

This operating mode is selected by the Signal Processing, Logic, and Control Block 260 through the four control bits $D_{TL}^{0-3}$. Bit $D_{TL}^0$ instructs Phase Detector 720 to calculate a phase error signal with its own internal data, rather than using data provided from Equalizer 175. The remaining control bits, $D_{TL}^{1-3}$, instruct Phase Detector 720 to calculate the specific error term selected by Signal Processing, Logic and Control Block 260.

Band edge timing recovery techniques work well for blind acquisition, provided there is sufficient signal power in the band edges. However, a single echo multipath ray can attenuate the signal power in the band edges, and prevent phase lock.

Operating Mode 2: Calculate CMA

An alternative blind approach to timing recovery minimizes a CM cost function, $J_{CM}(r,\tau)$, of the sampled data r(n) with respect to timing phase $\tau$, as proposed by Guglielmi et al. in "Joint Clock Recovery and Baseband Combining for the Diversity Radio Channel," IEEE Transactions on Communications, vol. 44. pp 114-117, January 1996, which is incorporated by reference, and further described by Chung et al. in "Timing Recovery Based on Dispersion Minimization," Proceedings of the 2001 Conference on Information Sciences and Systems, March 2001, which is incorporated by this reference.

The phase error is found by differentiating the cost function with respect to timing phase, $\tau$. Using calculus, this differentiation is usually decomposed into $$\frac{\partial J_{CM}(r, \tau)}{\partial \tau} = e_{TL}(n) \cdot \frac{\partial r}{\partial \tau}$$

where $e_{TL}(n)$ is an error term (in this case derived from r(n)) and $$\frac{\partial r}{\partial \tau}$$

is approximated in a variety or prior art methods, for example, using FIR filters in Lee and Messerchmitt, *Digital Communication*, Appendix 17-B, Kluwer Academic Publishers, Norwell, Mass., Second Edition, 1994 which is incorporated by reference. (This same decomposition is used for each of the phase error signals that we will describe and are derived by minimizing a cost function.) The CMA error term is calculated as $$e_{TL}(n)=r(n)\cdot(|r(n)|^2-\gamma)$$

The CMA error term calculated by Phase Detector 720 is selected by Signal Processing, Logic, and Control Block 260 using control bits $D_{TL}{}^{0-3}$. Bit $D_{TL}{}^0$ instructs Phase Detector 720 to supply a phase error signal that is calculated with an error term using its own internal data, rather than using the error term provided by the equalizer. In FIG. 8, bit $D_{TL}{}^0$ controls mux 835 for this selection. Control bits, $D_{TL}{}^{1-3}$ address mux 830 and are set according to the mux control table to select CMA. The derivative calculation in Derivative Calculator 810 uses sampled data r(n). The error term provided by mux 830 is multiplied in multiplier 825 by the derivative provided by Derivative Calculator 810, creating the phase error signal.

Operating Mode 3: Calculate LMS

A Mean Squared Error (MSE) style cost function $J_{MSE}(r,\tau)$ is minimized over the sampled data r(n) with respect to timing phase $\tau$ by Chung in "Blind Parameter Estimation for Data Acquisition in Digital Communications Systems". Ph.D. Dissertation, Cornell University, Ithaca, N.Y., August 2002 which is incorporated by reference.

The phase error is found by differentiating the cost function with respect to timing phase, $\tau$, and is of the form $$e_{TL}(n) = |\hat{r}(n) - r(n)|$$

where $\hat{r}(n)$ is a locally generated or stored hard decision estimate of the current received sample, for example, from a training sequence, a local (to Timing Recovery Loop 170) slicer, a reduced constellation mapping, or other method.

The LMS error term calculated by Phase Detector 720 is selected by Signal Processing, Logic, and Control Block 260 using control bits $D_{TL}{}^{0-3}$. Bit $D_{TL}{}^0$ instructs Phase Detector 720 to supply a phase error signal that is calculated with an error term using its own internal data, rather than using the error term provided by the equalizer. In FIG. 8, bit $D_{TL}{}^0$ controls mux 835 for this selection. Control bits, $D_{TL}{}^{1-3}$ address mux 830 and are set according to the mux control table to select LMS.

Operating Mode 4: Calculate Combo Error Term

Using the adaptive combining weight, $\lambda(n)$, provided by the Signal Processing, Logic, and Control Block 260, a combination error term, comprised of CMA and LMS error terms calculated in Operating Modes 2 and 3, is calculated by Phase Detector 720 according to $$e_{TL}(n) = (1 - \lambda(n)) \cdot e_{CMA}(n) + \lambda(n) \cdot e_{LMS}(n)$$

In FIG. 8, the adaptive combining weight, $\lambda(n)$, is supplied to Error Term Calculator 820, and control bits $D_{TL}{}^{1-3}$ supplied by Signal Processing, Logic, and Control Block 260 are set to select the combination error term in mux 830. Control bit $D_{TL}{}^0$ selects a phase error in mux 835 that is supplied by multiplier 825.

Operating Mode 5: No Update

In this operating mode, the phase error is set to zero. Control bit $D_{TL}{}^0$ selects a phase error in mux 835 that is supplied by multiplier 825, while control bits $D_{TL}{}^{1-3}$ select a zero-valued error term in mux 830.

Operating Mode 6: Use Error Term from Equalizer

In this operating mode, the error term calculated in Equalizer 175 is used in the phase error calculation. In FIG. 8, Derivative Calculator calculates a derivative using the equalizer output w(n) instead of the received data r(n). Control bit $D_{TL}{}^0$ selects a phase error in mux 835 that is supplied by multiplier 815, which multiplies the derivative from Derivative Calculator 810 with the equalizer error term e(n).

Joint, Adaptive Control of Equalization, Synchronization, and AGC

Figure 9A:
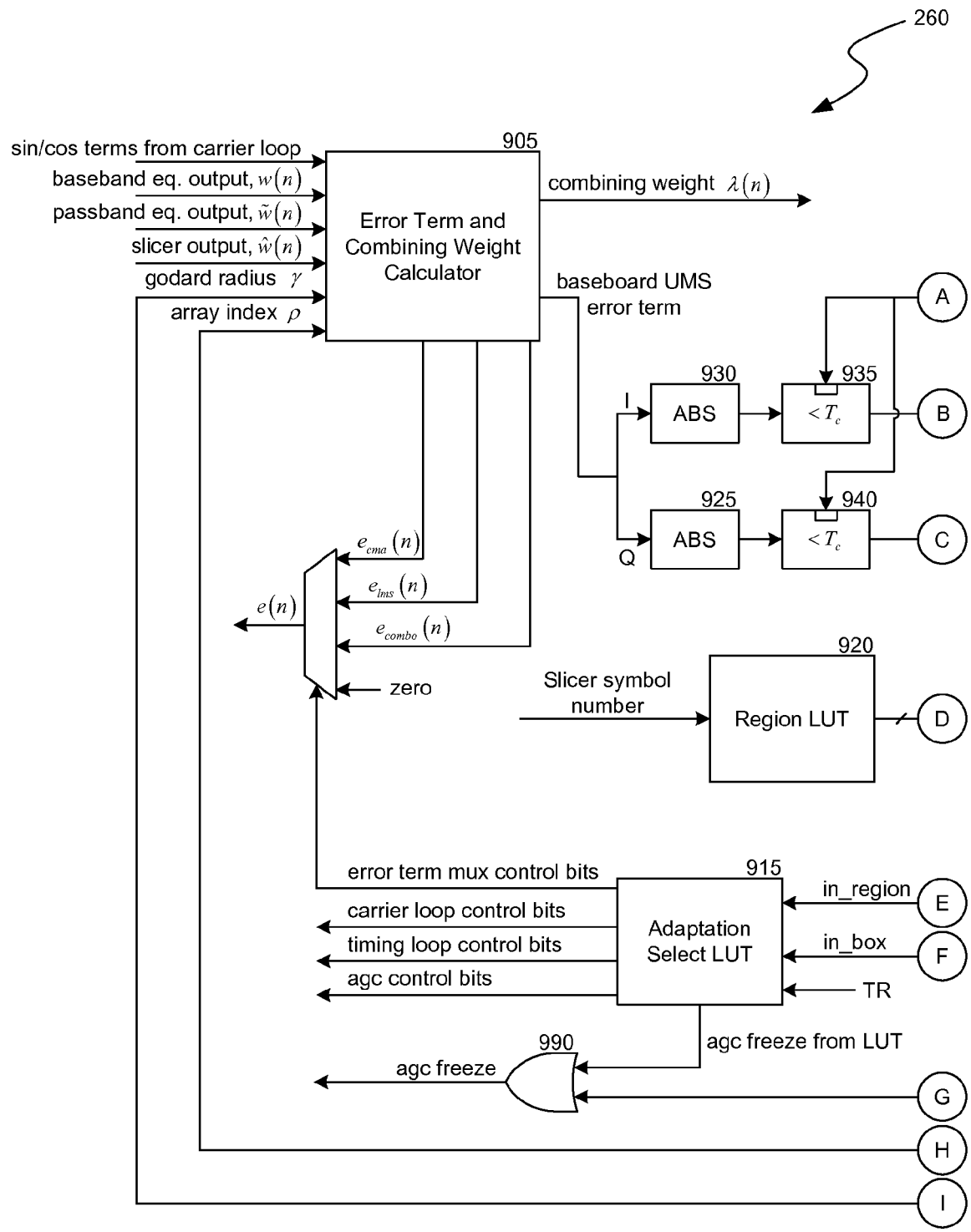
FIGS. 9A and 9B together show the: Signal Processing, Logic, and Control Block.
Figure 9B:
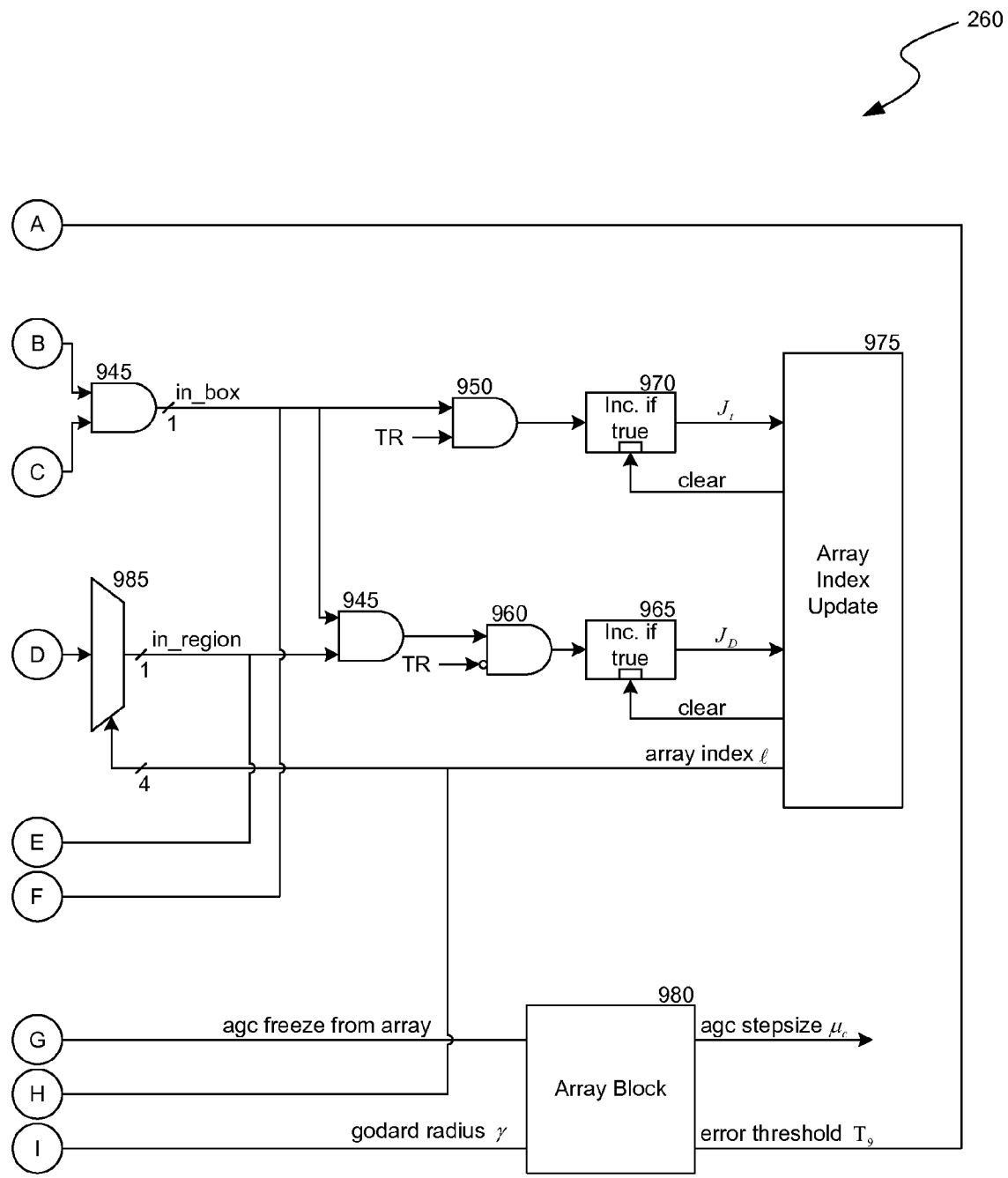

A block diagram of the Signal Processing, Logic, and Control Block 260 in accordance with certain aspects and embodiments of the present invention is shown in FIG. 9A and FIG. 9B. References to "FIG. 9" herein are references to FIG. 9A, FIG. 9B, or both, as appropriate. Note that a line terminating at an encircled letter A, B, C, D, E, F, G, H, or I in FIG. 9A is understood to continue from the corresponding encircled letter in FIG. 9B. Error Term and Combining Weight Calculator 905 has two functions: (i) to provide candidate error terms (like CMA, LMS, and their combination) that are calculated from equalizer samples, and (ii) to provide combining weight $\lambda(n)$.

To calculate candidate error terms, baseband and passband Equalizer 175 (FIG. 1) output samples, w(n) and $\tilde{w}(n)$, respectively, Slicer 270 (FIG. 2) hard decision output, $\hat{w}(n)$, and sine and cosine terms from Carrier Loop 180 are supplied to Error Term and Combining Weight Calculator 905. The combining weight $\lambda(n)$ can be calculated by methods in accordance with U.S. Ser. No. 60/341,931, entitled "Self-initializing decision feedback equalizer with automatic gain control," by T. J. Endres et al., filed Dec. 17, 2001, which are repeated here.

The combining weight is chosen at each baud instance by comparing the distance of the baseband soft decision, w(n), to its nearest element in the source constellation, and normalizing by the size of the decision region. This idea is illustrated in FIG. 10, using a 16-QAM alphabet.

Figure 10:
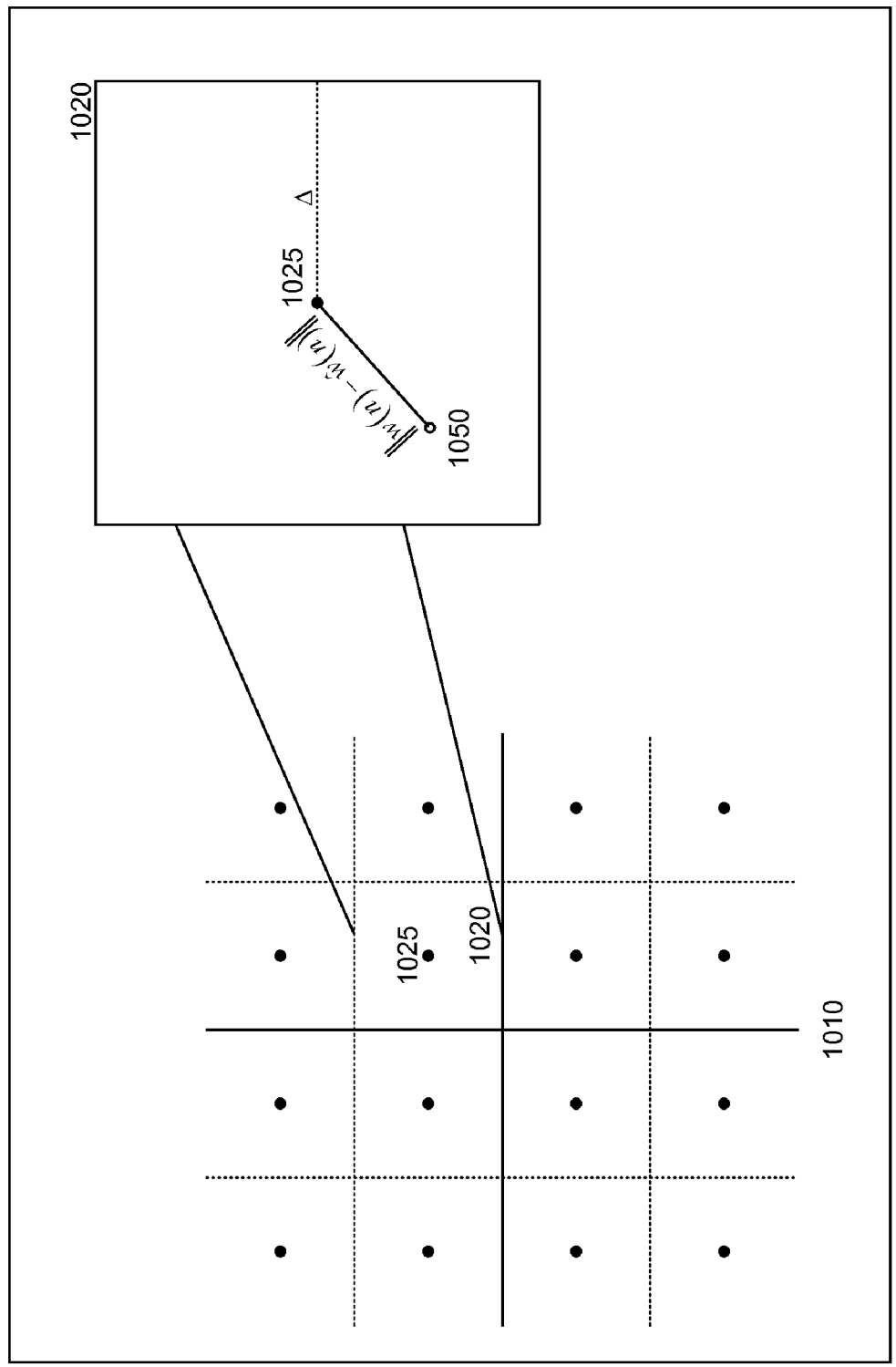
FIG. 10 shows a conceptual illustration of combining weight calculation.

The left-hand-side of FIG. 10 shows a 16-QAM constellation 1010, and the right-hand-side is an exploded view of a single decision region 1020 for the constellation point 1025. The width of the decision region is 2$\Delta$, and the distance of the scaled soft decision 350 to the constellation point 1025 is therefore $|w(n) - \hat{w}(n)|$. Excluding outermost constellation points that have open decision regions, the ratio $\tilde{\lambda}(n) = |w(n) - \hat{w}(n)|/\sqrt{2}\Delta$, does not exceed unity. For those outermost constellation points, if $\tilde{\lambda}(n)$ exceeds unity, it is set to unity. Hence, on an instantaneous basis, $\tilde{\lambda}(n)$ is bounded between zero and one, and provides an instantaneous measure of signal integrity: when the scaled soft decision 1050 is far from the hard decision (constellation point) 1025, $\tilde{\lambda}(n)$ is close to unity; when the scaled soft decision 1050 is close to the constellation point 1025, $\tilde{\lambda}(n)$ is close to zero.

To add memory or induce averaging to the instantaneous combining weight $\tilde{\lambda}(n)$, a leaky integrator is used, and the value of combining weight $\lambda(n)$ is calculated as $$\lambda(n) = (1 - \rho_\lambda) \cdot \lambda(n-1) + \rho_\lambda \cdot \tilde{\lambda}(n)$$

where $\rho_\lambda$ is the leakage term and is chosen less than or equal to one and greater than or equal to zero. Also, the combining weight $\lambda(n)$ may be compared to two thresholds, $T_U$ and $T_L$. If $\lambda(n) > T_U$, then $\lambda(n)$ is set to a register value, for example, unity; if $\lambda(n) < T_L$, then $\lambda(n)$ is set to another register value, for example, zero.

Figure 11:
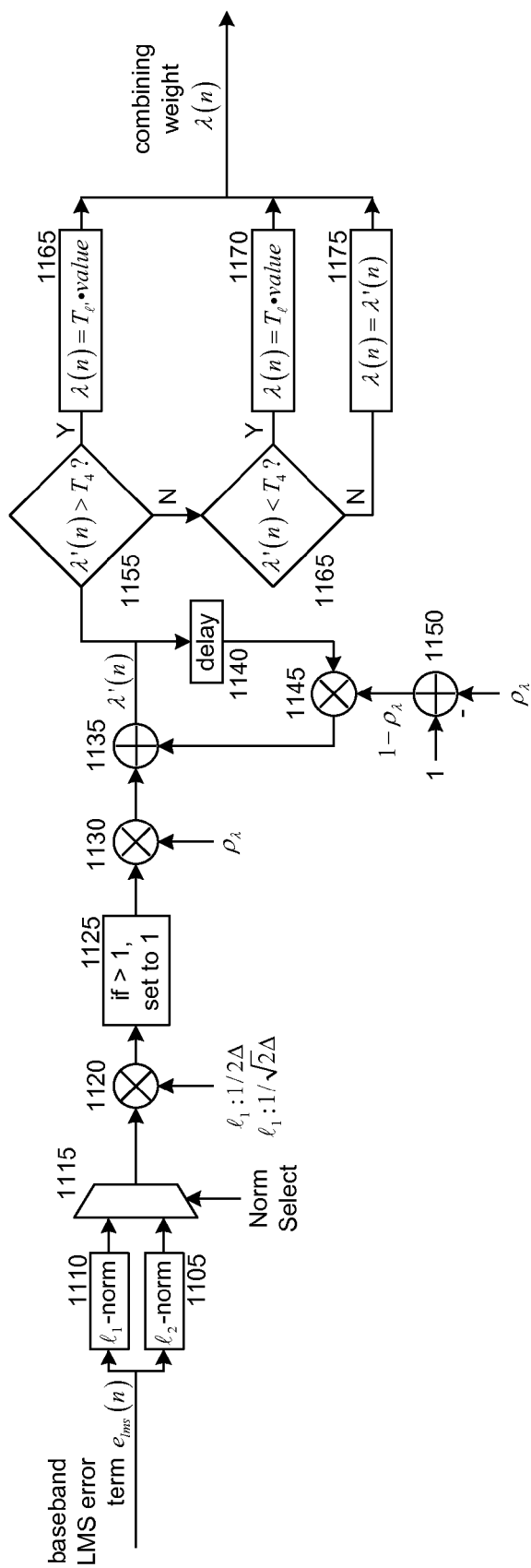
FIG. 11 shows a circuit used to calculate combining weight $\lambda(n)$ in accordance with certain aspects and embodiments of the present invention.

A circuit used to calculate the combining weight $\lambda(n)$ in accordance with certain aspects of the present invention is shown in FIG. 11. The baseband LMS error term is calculated and supplied to norm calculations 1105 and 1110, which calculate norms $\ell_2 = \sqrt{e_I^2 + e_Q^2}$ and $\ell_1 = |e_I| + |e_Q|$, respectively, where $e_I$ is the real part and $e_Q$ is the imaginary part of the baseband LMS error term. Mux 1115 selects the desired norm calculation, and multiplier 1120 normalizes the result so that the maximum value of the product (neglecting constellation points with open-ended decision regions) is unity, according to the norm selected. Block 1125 clips the result to unity, accounting for those constellation points with open-ended decision regions.

Multiplier 1130, adder 1135, delay 1140, and multiplier 1145 comprise a leaky integrator, or averaging circuit. Multiplier 1130 scales the clipped value from block 1125 by the leakage amount $\rho_\lambda$. This product is summed with the output of multiplier 1145 in adder 1135. The result is delayed in delay element 1140, scaled by the leakage amount $1-\rho_\lambda$ in multiplier 1145 and then supplied to adder 1135.

The output of adder 1135 is first compared to upper threshold $T_U$ in comparator 1155. If this first comparison is satisfied, the combining weight is set to programmable upper value $T_U$-value in assignment block 1165. If this first comparison is not satisfied, the output of adder 1135 is next compared to lower threshold $T_L$. If this second comparison is satisfied, the combining weight is set to programmable lower value $T_L$-value in assignment block 1170. If this second comparison is not satisfied, the output of adder 1135 remains unchanged in assignment block 1175.

An alternative embodiment of the present invention calculates a combining weight $\lambda(n)$ by indexing a programmable array of stored combining weight values, indexed by array index $\ell$ provided by Array Index Update block 975.

Referring again to FIG. 9, the Error Term and Combining Weight Calculator 905 supplies candidate error terms to mux 910, and the baseband LMS error term is split into in-phase (I) and quadrature-phase (Q) components and supplied to absolute value blocks 930 and 925, respectively. The absolute values of I and Q components are compared to threshold $T_e$ in comparison blocks 935 and 940, respectively. Comparison blocks 935 and 940 output a single bit each, designating true or false comparisons. Furthermore, the threshold $T_e$ used in comparison blocks 935 and 940 is adjusted over time and supplied by Array Block 980. The output bits of comparison blocks 935 and 940 are logically compared in AND gate 945, generating control signal in_box. This control signal is therefore an instantaneous indicator of the proximity of the soft decision sample to the hard decision sample, conditioned upon the current value of threshold $T_e$.

Figure 12:
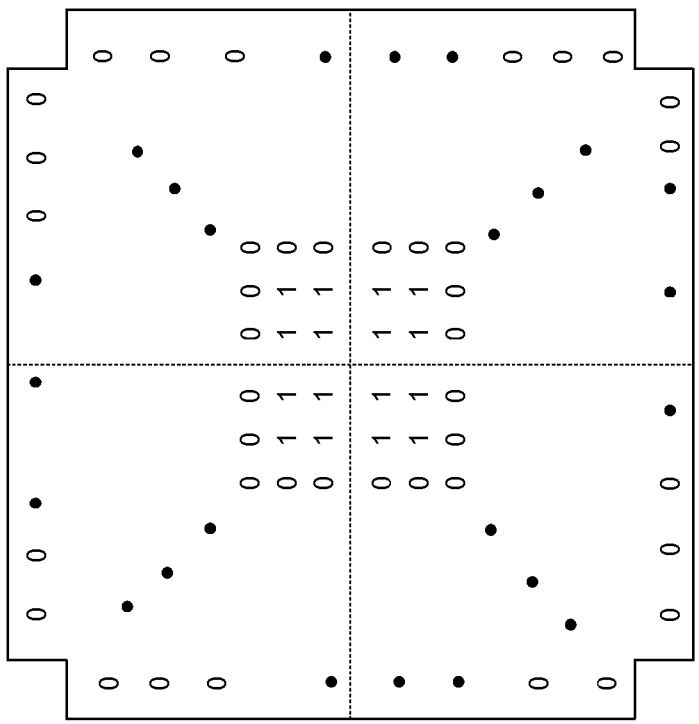
FIG. 12 shows a conceptual drawing illustrating two possible templates used to discern a control signal in accordance with certain aspects and embodiments of the present invention.
Figure 12:
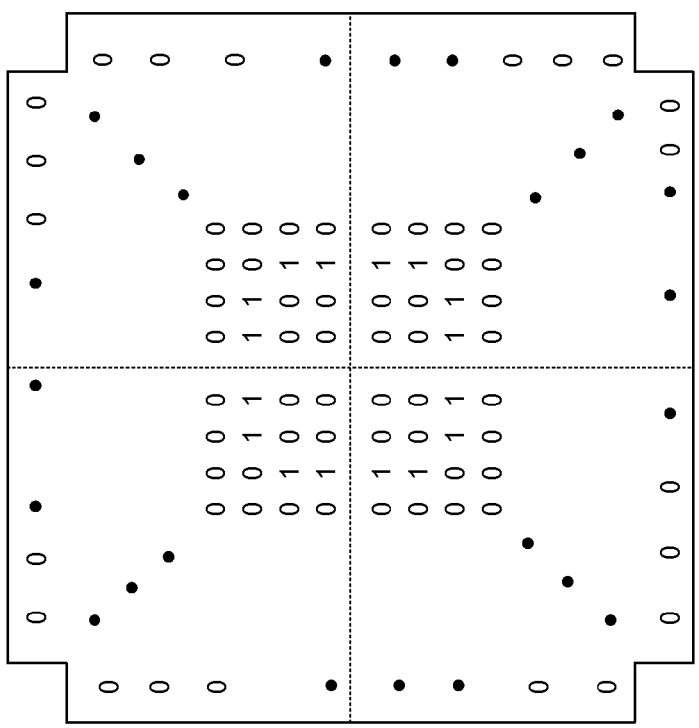

A second control signal used in the Signal Processing, Logic, and Control Block 260 is generated based on the position of the hard decision sample in the source constellation, conditioned upon a prescribed template. For example, Slicer 270 supplies the symbol number (0 . . . M for M-ary QAM) prescribed to the hard decision sample in the constellation bit-to-symbol mapping (usually a type of grey code) to Region LUT 920. Region LUT 920 stores the desired template that is used to discern the second control signal. For example, FIG. 12 shows two such templates, and associate a bit with each constellation point. The left-hand plot encompasses an approximate annulus, while the right-hand plot encompasses the 16 most inner constellation points. Each template is stored in a single column of Region LUT 920, with row index determined by the symbol number 0 . . . M . One preferred embodiment of the present invention uses 16 such templates, so that the size of Region LUT is M×16, and the array index $\ell$ ranges from 0 . . . 15. The symbol number of the bit-to-symbol mapping provided by Slicer 270 addresses the Region LUT 920 and selects a single row of the LUT contents, providing a 16-bit result. This 16-bit result is addressed by the array index $\ell$ in mux 985, producing a second control signal referred to as in_region.

A third control signal used in the Signal Processing, Logic, and Control Block 260 is a training sequence indicator and is denoted by TR. This control signal is valid when the current sample is part of a training sequence sent by the transmitter, instead of bearing user data. It is apparent to one skilled in the art how to derive a training sequence indicator, for example using correlation techniques.

Control signals in_box and TR are logically compared in AND gate 950, and the result is supplied to an accumulator 970 that increments when the result is true. The accumulator 970 operates until a clear signal is provided by Array Index Update block 975, at which time accumulator 970 supplies its accumulated count, designated as $J_T$, to Array Index Update block 975, and resets its accumulator value to zero.

Control signals in_box and in_region are logically compared in AND gate 955, and the result is supplied to AND gate 960, which logically compares this result with the complement of control signal TR. The result of AND gate 960 is supplied to accumulator 965 that increments when the result is true. The accumulator 965 operates until a clear signal is provided by Array Index Update block 975, at which time accumulator 965 supplies its accumulated count, designated as $J_D$, to Array Index Update block 975, and resets its accumulator value to zero.

Figure 13:
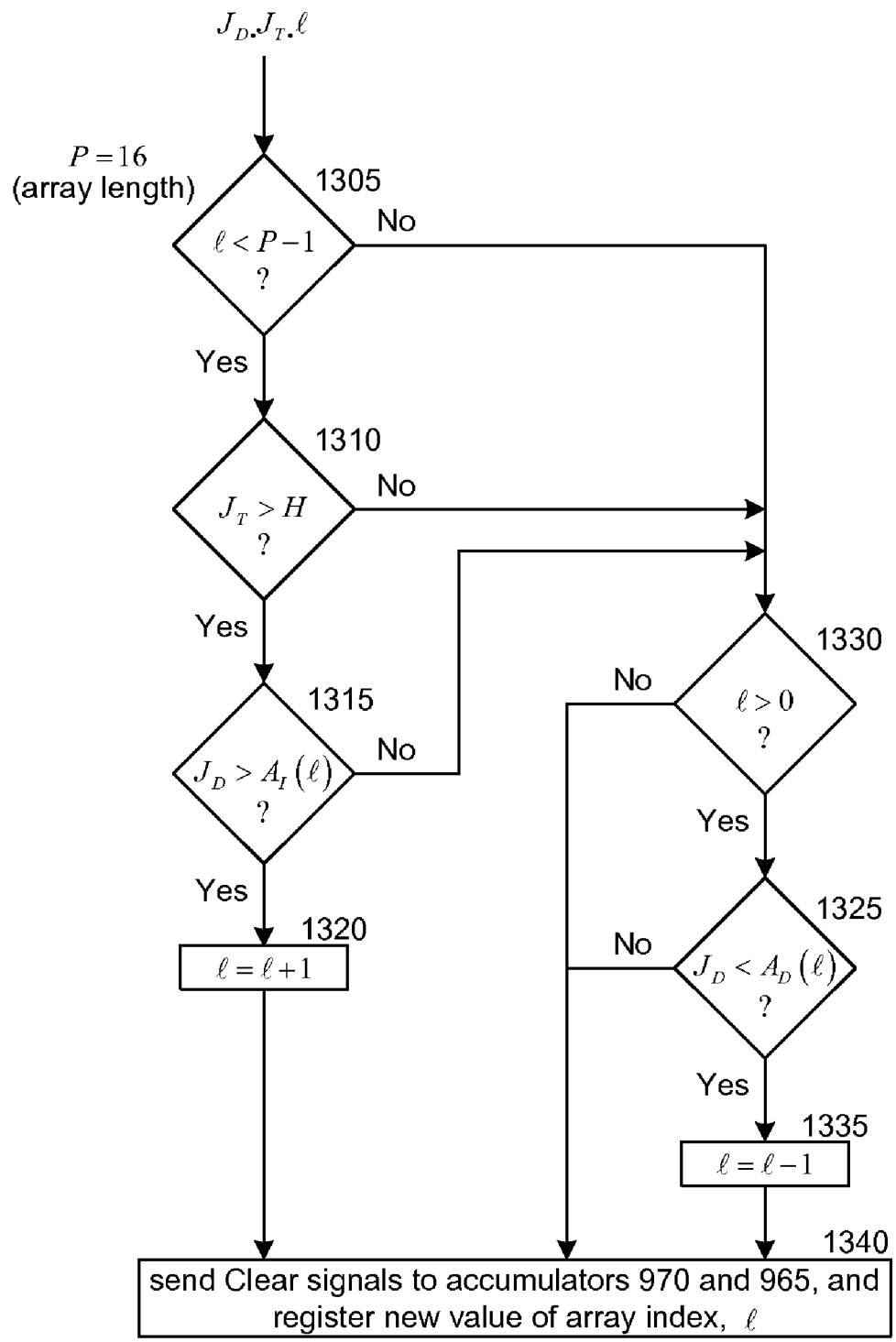
FIG. 13 shows a flow diagram illustrating the update of array index l in accordance with certain aspects and embodiments of the present invention.

Array Index Update block 975 calculates array index $\ell$ ranging from 0 . . . 15 in the preferred embodiment of the present invention, according to the flow diagram in FIG. 13. This circuit is executed at an integer multiple of the baud period, depending on the desired window length. For example, for systems operating in dynamic multipath conditions that are fast relative to the baud rate, this circuit may be executed every 64 or 128 baud iterations; but for systems operating in slowly changing signaling conditions relative to the baud rate, this circuit may be executed only every $2^{14}$ or $2^{16}$ baud iterations. Furthermore, the execution rate may be changed over the course of demodulator operation, for example, smaller at the start of demodulator operation to achieve rapid convergence, then increased once the array index has crossed a prescribed threshold.

The circuit in FIG. 13 uses two arrays of length P (16 in a preferred embodiment of the present invention), denoted by $A_I$ and $A_D$, and one threshold, denoted by H. The values $J_D$ and $J_T$ from accumulators 965 and 970, respectively, and the current value of array index $\ell$ (usually initialized to zero at demodulator power up) are also used in this circuit. The left hand side of the circuit is used to increment array index $\ell$, while the right hand side is used to decrement array index $\ell$. Decision block 1305 checks to see that the current value of array index $\ell$ does not exceed the maximum value, P−1. If the current value of array index $\ell$ is less than P−1, then decision block 1310 is entered; else, the array index $\ell$ cannot be incremented and decision block 1320 is entered. Decision block 1310 compares $J_T$ from accumulator 970 to a predetermined threshold H. If $J_T$>H then decision block 1315 is entered; else, decision block 1320 is entered. Decision block 1315 compares $J_D$ from accumulator 965 to the value of increment array A, that is indexed by the current value of array index $\ell$, denoted by $A_I(\ell)$. If $J_D$>$A_I(\ell)$ then array index $\ell$ is incremented in increment block 1330 and output block 1340 is entered; else, decision block 1320 is entered.

Decision block 1320 checks to see that the current value of array index $\ell$ does not exceed the minimum value, 0. If $\ell$>0 is satisfied, then decision block 1325 is entered; else, output block 1340 is entered. Decision block 1325 compares $J_D$ from accumulator 970 to the value of decrement array $A_D$ that is indexed by the current value of array index $\ell$, denoted by $A_D(\ell)$. If $J_D$<$A_D(\ell)$ then array index $\ell$ is decremented in decrement block 1335 and output block 1340 is entered; else, output block 1340 is entered directly.

Output block 1340 sends "clear" signals to accumulators 965 and 970, resetting the count to zero in each, and loads another value of array index $\ell$, which has either been incremented, decremented, or is unchanged.

Referring again to the Signal Processing, Logic, and Control Block 260 in FIG. 9, the array index $\ell$ from Array Index Update block 975 is provided to Array Block 980. Array Block 980 stores a length-P (16 in a preferred embodiment of the present invention) array of threshold values $T_e$. The array index $\ell$ indexes this array and selects a new threshold $T_e$, which is provided to comparison blocks 935 and 940. Similarly, Array Block 980 stores a length-P array of stepsize values for the preferred embodiment of Feedback AGC 240, which is indexed by array index $\ell$. A new value of stepsize $\mu_\alpha$ is selected by array index $\ell$ and provided to Feedback AGC 240.

For the alternative embodiment of Feedback AGC 240, Array Block 980 stores a length-P array of freeze bits. The freeze bit selected by array index $\ell$ is provided to logical OR gate 990.

Moreover, Array Block 980 stores a length-P array of godard radius values, $\gamma$, one of which is used for CMA error term calculation. The elements stored in the array of godard radius values can be pre-calculated in accordance with the templates that are stored in Region LUT 920 corresponding to the current value of array index $\ell$. For example, since arbitrary templates of constellation points can be designed for inclusion in Region LUT 920, the CMA error term should be calculated based on the effective source constellation it sees (a subset of the full QAM source constellation), which could be the values stored in the present template of Region LUT 920, or their complement. This choice depends on the design of the Adaptation Select LUT 915. The godard radius selected by array index $\ell$ is provided to Error Term and Combining Weight Calculator 905, and used in the CMA error term calculation.

Array Block 980 can also store arrays for other demodulator parameters, like stepsizes for adaptive filters 220 and 230. Each array is indexed by array index $\ell$, and a new parameter is provided by Array Block 980 for demodulator operation.

The three control signals, in_box, in_region, and TR are used also as address bits to Adaptation Select LUT 915. Adaptation Select LUT 915 stores a programmable LUT that contains various control bits for demodulator operation, whose selected values are contingent upon the current values of control signals in_box, in_region, and TR. For example, Adaptation Select LUT 915 outputs two control bits that govern mux 910, which selects the error term used in update of Equalizer 175 coefficients, choosing from among LMS, CMA, combined LMS and CMA (using combining weight $\lambda(n)$), and zero, at each baud instance. An example adaptation strategy may be to use an LMS error term, derived from training data, when TR is true; CMA when in_region is true and in_box is not; a combination error term when both in_region and in_box are true, and a zero-valued error term otherwise. The Adaptation Select LUT 915 can be programmed to accommodate a variety of adaptation strategies, not limited to this example. Furthermore, the Adaptation Select LUT 915 can be reloaded over the course of demodulator operation, for example, contingent on the value of array index $\ell$, an estimate of demodulated SNR, or after a prescribed amount of time, so that the adaptation strategy is itself changed over the course of demodulator operation.

The Adaptation Select LUT 915 contains control bits for other demodulator operations, too. For example, referring again to FIG. 5, three control signals are shown that govern Carrier Loop 250 operation. Control signal 1 governs mux 510 that selects a hard decision sample from Slicer 270 or Coarse Tune Hard Decision Block 505. One strategy selects the hard decision sample from Slicer 270 when all of TR, in_region, and in_box are true, or when only in_region and in_box are true, and selects a hard decision sample from coarse tune Hard Decision Block 505 otherwise. Control signal 2 is used to govern mux 520, and may select a zero-valued phase error when TR, in_region, and in_box are false, indicating low quality of demodulator performance, instead of selecting the phase error generated by Phase Detector 515. Control Signal 3 is used to select the style of hard decision generated from Coarse Tune Hard Decision Block 505, selecting from among the five operating modes of Carrier Loop 250 previously described.

Adaptation Select LUT 915 also contains control bits for Feedback AGC 177 operation. For the preferred embodiment of Feedback AGC 177, four operating modes have been identified, and can be selected on a symbol-by-symbol basis using the control bits for from Adaptation Select LUT 915. The association of operating mode to control signals in_box, in_region, and TR depends upon the templates stored in Region LUT 920. For example, if Region LUT 920 stores an annulus (as described in the left subplot of FIG. 12), then a CM-like cost function may be chosen when in_region is true; however, if Region LUT 920 stores inner constellation points (as described in the right subplot of FIG. 12), then an LMS-like cost function may be chosen when in_region is true.

If the alternative embodiment of Feedback AGC 177, illustrated in FIG. 4, is used, then control bits from Adaptation Select LUT 915 determine the operating modes previously described for FIG. 4. One of the control bits from Adaptation Select LUT 915 is provided to logical OR gate 990, together with a control bit from Array Block 980. The result from logical OR gate 990 is used to select the operating mode that determines AGC freeze.

Adaptation Select LUT 915 also contains control bits for Timing Recovery Loop 170, that determine the operating mode from among the six operating modes previously discussed in FIG. 7. Moreover, control bits are provided to Loop Filter 730 from Adaptation Select LUT 915 that govern loop constants for proportional and integral control. For example, one of these control bits if true selects loop constants from registered values set by the user or application software, or if false according to a predetermined table. One such table is below:

| Control Bits to Loop Filter | Proportional Loop Constant | Integral Loop Constant |
| --- | --- | --- |
| 0 0 | Registered value | Registered value |
| 0 1 | Registered value/8 | Registered value/8 |
| 1 0 | Registered value/8 | Registered value/16 |
| 1 1 | 0 | 0 |

The methods described in FIG. 9 for the Signal Processing, Logic, and Control Block 260 facilitate extremely flexible demodulator operation, since LUTs are programmable, and can be selected for a desired operational environment of the demodulator. For example, the templates stored in Region LUT 920 can be designed so that outer-most signal points are handled differently, to account for nonlinear effects caused by high power amplifiers in the transmitter. Adaptation strategies for physical layer functions can be completely modified by simple LUT change, and if re-loaded while the demodulator is operating, adaptation strategies can be changed "on-the-fly". Furthermore, the counters and telemetry points in the Signal Processing, Logic and Control Block 260 (FIG. 9) can be useful indicators of demodulator health, and provide signal quality assessment to the user, aiding in antenna placement or other tasks needing receiver feedback.

One skilled in the art would understand that the equations described herein may include scaling, change of sign, or similar constant modifications that are not shown for simplicity. One skilled in the art would realize that such modifications can be readily determined or derived for the particular implementation. Thus, the described equations may be subject to such modifications, and are not limited to the exact forms presented herein.

Certain aspects and embodiments of the present invention have been described using Quadrature Amplitude Modulation (QAM) signals with complex signal processing, unless specifically noted. However, one skilled in the art would realize that the techniques described herein may be applied to a receiver processing Phase-Shift Keyed (PSK), Pulse Amplitude Modulation (PAM), or other signals.

As would be apparent to one skilled in the art, the various functions of equalization, signal combining, automatic gain control, carrier recovery, and timing recovery may be implemented with circuit elements or may also be implemented in the digital domain as processing steps in a software program. Such software may be employed in, for example, a digital signal processor, micro-controller, or general-purpose computer.

The present invention can be embodied in the form of methods and apparatuses for practicing those methods. The present invention can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

It will be further understood that various changes in the details, materials, and arrangements of the parts which have been described and illustrated in order to explain the nature of this invention may be made by those skilled in the art without departing from the principle and scope of the invention as expressed in the following claim.

What is claimed is:

1. A wireless communications receiver comprising:
a first receiver component configured to form soft decision samples corresponding to a received signal;
a second receiver component configured to form hard decision samples corresponding to the received signal; and
a signal processing and control block;
wherein the signal processing and control block is configured to derive control signals from the soft decision samples and the hard decision samples;
wherein the control signals include an error term; and
wherein the control signals include a combining weight based on a normalized difference between the soft decision samples and the hard decision samples, or based on indexing a programmable array of stored combining weight values, or on both; and
wherein the communication receiver is configured to use the control signals to operate a timing recovery module, a carrier recovery module, an automatic gain control module, and an equalization module.

2. The communication receiver of claim 1, further configured to adjust a sampling phase and frequency of the received signal.

3. The communication receiver of claim 1, wherein the combining weight is further based on comparing the soft decision sample to an element in a source constellation.

4. The communication receiver of claim 1, wherein the combining weight is further based on a prior value of the combining weight.

5. The communication receiver of claim 1, further configured to derive an in_box signal that indicates the instantaneous proximity of the soft decision sample to the hard decision sample.

6. The communication receiver of claim 1, further configured to derive an in_region signal generated based on the position of a hard decision sample in a source constellation conditioned upon a prescribed template.

7. The communication receiver of claim 1, further configured to derive a training sequence indicator valid when a current sample is part of a training sequence.

8. The communication receiver of claim 1, wherein the communications receive is configured to operate in one or more adaptation modes including a Least Mean Squares (LMS) mode, a Constant Modulus Algorithm (CMA) mode, a combination LMS and CMA mode, and a halt mode.

9. The communication receiver of claim 1, wherein the combining weight is utilized to adaptively combine soft decision samples and hard decision samples to form alternative hard decision samples.

10. The communication receiver of claim 1, wherein quadrant mapping of the soft decision samples is used to form alternative hard decision samples.

11. The communication receiver of claim 1, wherein the soft decision samples are quantized to a reduced constellation to form alternative hard decision samples.

12. The communication receiver of claim 1, wherein end points of the soft decision samples are rounded and saturated to a bit-width wider than the hard decision samples to form alternative hard decision samples.

13. The communication receiver of claim 1, wherein alternative hard decision samples are generated according to an arbitrary nonlinear curve.

14. The communication receiver of claim 1, further comprising a phase detector configured to receive hard decision samples or alternative hard decision samples.

15. The communication receiver of claim 1, wherein the error term is a Least Mean Squares (LMS) term, a Constant Modulus Algorithm (CMA) term, or a combination LMS and CMA term.

16. A system, comprising:
a control signal calculator configured to derive control signals from soft decision samples and hard decision samples,
wherein the control signals
include an error term, and
include a combining weight based on a normalized difference between the soft decision samples and the hard decision samples, or on indexing a programmable array of stored combining weight values, or on both;

wherein the control signal calculator is configured to receive the soft decision samples and the hard decision samples from a receiver configured to form the soft decision samples and the hard decision samples corresponding to the received signal; and wherein the control signal calculator is configured to send the control signals to the receiver to operate a timing recovery module of the receiver, a carrier recovery module of the receiver, an automatic gain control module of the receiver, and an equalization module of the receiver.

17. The system of claim 16, wherein the receiver is further configured to adjust a sampling phase and frequency of the received signal.

18. The system of claim 16, wherein the combining weight is further based on comparing the soft decision sample to an element in a source constellation.

19. The system of claim 16, wherein the combining weight is further based on a prior value of the combining weight.

20. The system of claim 16, wherein the receiver is further configured to derive an in_box signal that indicates the instantaneous proximity of the soft decision sample to the hard decision sample.

21. The system of claim 16, wherein the receiver is further configured to derive an in_region signal generated based on the position of a hard decision sample in a source constellation conditioned upon a prescribed template.

22. The system of claim 16, wherein the receiver is further configured to derive a training sequence indicator valid when a current sample is part of a training sequence.

23. The system of claim 16, wherein the system is further configured to operate in one or more adaptation modes including a Least Mean Squares (LMS) mode, a Constant Modulus Algorithm (CMA) mode, a combination LMS and CMA mode, and a halt mode.

24. The system of claim 16, wherein the combining weight is utilized to adaptively combine soft decision samples and hard decision samples to form alternative hard decision samples.

25. The system of claim 16, wherein quadrant mapping of the soft decision samples is used to form alternative hard decision samples.

26. The system of claim 16, wherein the soft decision samples are quantized to a reduced constellation to form alternative hard decision samples.

27. The system of claim 16, wherein end points of the soft decision samples are rounded and saturated to a bit-width wider than the hard decision samples to form alternative hard decision samples.

28. The system of claim 16, wherein alternative hard decision samples are generated according to an arbitrary nonlinear curve.

29. The system of claim 16, wherein the receiver includes a phase detector configured to receive hard decision samples or alternative hard decision samples.

30. The system of claim 16, wherein the error term is a Least Mean Squares (LMS) term, a Constant Modulus Algorithm (CMA) term, or a combination LMS and CMA term.

31. In a wireless communications receiver, a system comprising:
means for forming soft decision samples corresponding to a received signal and hard decision samples corresponding to the received signal;

means for deriving control signals from the soft decision samples and the hard decision samples, wherein the control signals comprise an error term and a combining weight, wherein the combining weight is based on a normalized difference between the soft decision samples and the hard decision samples, or on indexing a programmable array of stored combining weight values, or on both; and means for using the control signals to jointly operate of a timing recovery module of the communications receiver, a carrier recovery module of the communications receiver, an automatic gain control module of the communications receiver, and an equalization module of the communications receiver.

32. The system of claim 31, further comprising means for adjusting a sampling phase and frequency of the received signal.

33. The system of claim 31, wherein the combining weight is further based on comparing the soft decision sample to an element in a source constellation.

34. The system of claim 31, wherein the combining weight is further based on a prior value of the combining weight.

35. The system of claim 31, further comprising means for deriving an in_box signal that indicates the instantaneous proximity of the soft decision sample to the hard decision sample.

36. The system of claim 31, further comprising means for deriving an in_region signal generated based on the position of a hard decision sample in a source constellation conditioned upon a prescribed template.

37. The system of claim 31, further comprising means for deriving a training sequence indicator valid when a current sample is part of a training sequence.

38. The system of claim 31, further comprising means for operating in one or more adaptation modes including a Least Mean Squares (LMS) mode, a Constant Modulus Algorithm (CMA) mode, a combination LMS and CMA mode, and a halt mode.

39. The system of claim 31, wherein the combining weight is utilized to adaptively combine soft decision samples and hard decision samples to form alternative hard decision samples.

40. The system of claim 31, wherein quadrant mapping of the soft decision samples is used to form alternative hard decision samples.

41. The system of claim 31, wherein the soft decision samples are quantized to a reduced constellation to form alternative hard decision samples.

42. The system of claim 31, wherein end points of the soft decision samples are rounded and saturated to a bit-width wider than the hard decision samples to form alternative hard decision samples.

43. The system of claim 31, wherein alternative hard decision samples are generated according to an arbitrary nonlinear curve.

44. The system of claim 31, further comprising means for providing hard decision samples or alternative hard decision samples to a phase detector.

45. The system of claim 31, wherein the error term is a Least Mean Squares (LMS) term, a Constant Modulus Algorithm (CMA) term, or a combination LMS and CMA term.

* * * * *

UNITED STATES PATENT AND TRADEMARK OFFICE
CERTIFICATE OF CORRECTION

PATENT NO.         : 8,194,791 B2
APPLICATION NO.    : 12/546605
DATED              : June 5, 2012
INVENTOR(S)        : Endres et al.

It is certified that error appears in the above-identified patent and that said Letters Patent is hereby corrected as shown below:

In Column 4, Line 1, delete "Feasibility" and insert -- "Feasibility --, therefor.

In Column 7, Line 28, after equation, insert -- . --.

In Column 7, Line 35, after equation, insert -- . --.

In Column 7, Line 42, after equation, insert -- . --.

In Column 7, Line 57, after equation, insert -- . --.

In Column 8, Line 12, delete "$\pi_\alpha$" and insert -- $\rho_\alpha$ --, therefor.

In Column 8, Line 25, delete "$\xi(n-1)=(1-\rho_{age})\cdot\xi(n-2)+\rho_{age}\cdot\tilde{\zeta}(n-1)$," and insert -- $\xi(n-1) = (1-\rho_{agc})\cdot\xi(n-2)+\rho_{agc}\cdot\tilde{\zeta}(n-1)$ --, therefor.

In Column 8, Line 30, delete "$\rho_{age}$" and insert -- $\rho_{agc}$ --, therefor.

In Column 8, Line 31, delete "$\rho_{age}$" and insert -- $\rho_{agc}$ --, therefor.

In Column 9, Line 57, after equation, insert -- . --.

In Column 9, Line 62, delete "F," and insert -- $\Gamma$, --, therefor.

In Column 9, Line 65, after equation, insert -- . --.

In Column 12, Line 1, delete "combing" and insert -- combining --, therefor.

Signed and Sealed this
Eighth Day of January, 2013

David J. Kappos
*Director of the United States Patent and Trademark Office*

CERTIFICATE OF CORRECTION (continued)
U.S. Pat. No. 8,194,791 B2

In Column 15, Line 14, delete "basband" and insert -- baseband --, therefor.

In Column 16, Line 25, delete "In" and insert -- in --, therefor.

In Column 16, Line 39, delete "combing" and insert -- combining --, therefor.

In Column 18, Line 65, after equation, insert -- . --.

In Column 19, Line 47, after equation, insert -- . --.